US012689070B2

(12) United States Patent
Ruan et al.

(10) Patent No.: US 12,689,070 B2
(45) Date of Patent: Jul. 21, 2026

(54) CHARGE/DISCHARGE TEST APPARATUS, BATTERY TEST SYSTEM, AND BATTERY PRODUCTION SYSTEM

(71) Applicant: CONTEMPORARY AMPEREX TECHNOLOGY (HONG KONG) LIMITED, Hong Kong (CN)

(72) Inventors: Keyu Ruan, Ningde (CN); Haiyang Li, Ningde (CN); Lixin Guo, Ningde (CN); Bo Liu, Ningde (CN); Shaoteng Ren, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 234 days.

(21) Appl. No.: 18/396,658

(22) Filed: Dec. 26, 2023

(65) Prior Publication Data

US 2024/0145795 A1 May 2, 2024

(30) Foreign Application Priority Data

Oct. 27, 2022 (CN) .......................... 202222849415.9
Apr. 17, 2023 (CN) ......................... 202310410938.X

(51) Int. Cl.
*G01R 31/36* (2020.01)
*G01R 31/364* (2019.01)
(Continued)

(52) U.S. Cl.
CPC ...... *H01M 10/4285* (2013.01); *G01R 31/364* (2019.01); *G01R 31/3644* (2013.01);
(Continued)

(58) Field of Classification Search
None
See application file for complete search history.

(56) References Cited

U.S. PATENT DOCUMENTS

| | | | |
|---|---|---|---|
| 5,903,154 A | 5/1999 | Zhang et al. | |
| 5,914,609 A | 6/1999 | Curry et al. | |
| | (Continued) | | |

FOREIGN PATENT DOCUMENTS

| | | | |
|---|---|---|---|
| CN | 105024100 A | 11/2015 | |
| CN | 105190986 A | 12/2015 | |
| | (Continued) | | |

OTHER PUBLICATIONS

English Translation of JP 2013-145131-A (Year: 2013).*
(Continued)

*Primary Examiner* — Jermele M Hollington
(74) *Attorney, Agent, or Firm* — Anova Law Group, PLLC

(57) ABSTRACT

A charge/discharge test apparatus includes a temperature control box having a test chamber provided inside and provided with an opening communicated with the test chamber and configured for extraction or insertion of a battery, and a rack connected to the temperature control box. The rack and the opening are located at different sides of the temperature control box, and the rack has an accommodating cavity inside. The charge/discharge test apparatus further includes a charge/discharge module located in the accommodating cavity and configured to charge/discharge a battery in the corresponding test chamber.

20 Claims, 10 Drawing Sheets

(51) Int. Cl.

| | |
|---|---|
| *G01R 31/385* | (2019.01) |
| *H01M 10/42* | (2006.01) |
| *H01M 10/44* | (2006.01) |
| *H02J 7/00* | (2026.01) |
| *H02J 7/65* | (2026.01) |
| *H02J 7/70* | (2026.01) |
| *H02J 7/50* | (2026.01) |

(52) U.S. Cl.
CPC ...... *G01R 31/3865* (2019.01); *H01M 10/441* (2013.01); *H02J 7/65* (2026.01); *H02J 7/751* (2026.01); *H02J 7/50* (2026.01)

(56) References Cited

U.S. PATENT DOCUMENTS

| | | | |
|---|---|---|---|
| 10,950,900 | B2 | 3/2021 | Hahn et al. |
| 11,885,851 | B2 | 1/2024 | Kim et al. |
| 2012/0276430 | A1 | 11/2012 | Witting |
| 2013/0141107 | A1 | 6/2013 | Yuasa |
| 2015/0194707 | A1 | 7/2015 | Park |
| 2020/0064407 | A1* | 2/2020 | Zhang .................. G01R 31/371 |
| 2021/0020260 | A1 | 1/2021 | Tsai et al. |
| 2022/0231346 | A1 | 7/2022 | Chae et al. |
| 2023/0194613 | A1 | 6/2023 | Kaneko |
| 2024/0111647 | A1 | 4/2024 | Nam et al. |
| 2024/0145796 | A1* | 5/2024 | Ruan .................. G01R 31/364 |
| 2024/0186667 | A1 | 6/2024 | Do et al. |
| 2024/0230764 | A1 | 7/2024 | Li et al. |
| 2025/0028004 | A1 | 1/2025 | Hyun |

FOREIGN PATENT DOCUMENTS

| | | | | | |
|---|---|---|---|---|---|
| CN | 207542354 | U | 6/2018 | | |
| CN | 108490367 | A | 9/2018 | | |
| CN | 109541477 | A | 3/2019 | | |
| CN | 208888351 | U | 5/2019 | | |
| CN | 209979684 | U | 1/2020 | | |
| CN | 110794318 | A | 2/2020 | | |
| CN | 211062810 | U | 7/2020 | | |
| CN | 211653026 | U | 10/2020 | | |
| CN | 211718477 | U | 10/2020 | | |
| CN | 111948550 | A | 11/2020 | | |
| CN | 212031673 | U | 11/2020 | | |
| CN | 212321669 | U | 1/2021 | | |
| CN | 112557934 | A | 3/2021 | | |
| CN | 212808360 | U | 3/2021 | | |
| CN | 112803093 | A | 5/2021 | | |
| CN | 113540632 | A | 10/2021 | | |
| CN | 214622978 | U | 11/2021 | | |
| CN | 215297614 | U | 12/2021 | | |
| CN | 215415796 | U | 1/2022 | | |
| CN | 215768925 | U | 2/2022 | | |
| CN | 215986169 | U | 3/2022 | | |
| CN | 216117702 | U | 3/2022 | | |
| CN | 216411514 | U | 4/2022 | | |
| CN | 114552735 | A | 5/2022 | | |
| CN | 114768910 | A | 7/2022 | | |
| CN | 114787639 | A | 7/2022 | | |
| CN | 115207553 | A | 10/2022 | | |
| CN | 217587444 | U | 10/2022 | | |
| CN | 217639162 | U | 10/2022 | | |
| CN | 115485921 | A | 12/2022 | | |
| CN | 218956652 | U | 5/2023 | | |
| DE | 102024129523 | A1 | 12/2024 | | |
| EP | 2388845 | A1 | 11/2011 | | |
| EP | 2993725 | A1 | 3/2016 | | |
| EP | 4184653 | A1 | 5/2023 | | |
| EP | 4386405 | A1 | 6/2024 | | |
| JP | 2013145131 | A | 7/2013 | | |
| JP | 5769640 | B2 | 8/2015 | | |
| JP | 2022108378 | A * | 7/2022 | ........ | H02J 7/007182 |
| KR | 20130000598 | A | 1/2013 | | |
| KR | 20200015066 | A | 2/2020 | | |
| TW | 201211567 | A | 3/2012 | | |
| WO | 2022167955 | A1 | 8/2022 | | |

OTHER PUBLICATIONS

English Translation of KR-101519708-B1 (Year: 2015).*
English Translation of JP-2022108378-A (Year: 2022).*
The World Intellectual Property Organization (WIPO) International Search Report for PCT/CN2023/120967 Nov. 20, 2023 7 Pages (including translation).
The World Intellectual Property Organization (WIPO) International Search Report for PCT/CN2023/082924 Oct. 7, 2023 7 Pages (including translation).
The European Patent Office (EPO) The Extended European Search Report for Application No. 23733827.2 Nov. 18, 2024 8 Pages.
The European Patent Office (EPO) The Partial European Search Report for Application No. 23220667.2 Jul. 15, 2024 15 Pages.
The World Intellectual Property Organization (WIPO) International Search Report for PCT/CN2023/085238 7 Pages (including translation) Jul. 21, 2023.
United States Patent and Trademark Office (USPTO) Non-final Rejection for U.S. Appl. No. 18/473,306, Jun. 30, 2025 13 Pages.
United States Patent and Trademark Office (USPTO) Notice Of Allowance for U.S. Appl. No. 19/086,173, Jul. 29, 2025 8 Pages.
United States Patent and Trademark Office (USPTO) Non-final Rejection for U.S. Appl. No. 18/219,275, Mar. 13, 2025 70 Pages.
United States Patent and Trademark Office (USPTO) Non-final Rejection for U.S. Appl. No. 19/086,173, Apr. 23, 2025 86 Pages.
The European Patent Office (EPO) The Extended European Search Report for Application No. 23734892.5 Apr. 3, 2025 8 Pages.
United States Patent and Trademark Office Notice of Allowance for U.S. Appl. No. 18/473,306, Oct. 28, 2025 12 pages.

* cited by examiner

CHARGE/DISCHARGE TEST APPARATUS, BATTERY TEST SYSTEM, AND BATTERY PRODUCTION SYSTEM

CROSS-REFERENCE TO RELATED APPLICATIONS

This application claims priority to Chinese Patent Application No. 202310410938.X, filed on Apr. 17, 2023, and Chinese Patent Application No. 202222849415.9, filed on Oct. 27, 2022, entitled "Battery Charge/Discharge Test Apparatus", the entire contents of which are incorporated herein by reference.

TECHNICAL FIELD

This application relates to the field of battery test technologies, and in particular, to a charge/discharge test apparatus, a battery test system, and a battery production system.

BACKGROUND

In the charge/discharge process of the battery, it may experience swelling, which affects the reliability of the battery. With each charge/discharge cycle of the battery, the electrolyte is continuously consumed, which affects the lifespan of the battery. Therefore, after production, it is needed to test the performance of the battery, especially the stability during charge/discharge at different temperatures. However, due to the structural design flaws of the traditional charge/discharge test apparatus, the test apparatus has the issues of low integration and large space occupation.

SUMMARY

For this reason, it is needed to provide a charge/discharge test apparatus, a battery test system, and a battery production system, so as to alleviate the issues of low integration and large space occupation of the charge/discharge test apparatus.

According to a first aspect, this application provides a charge/discharge test apparatus, where the charge/discharge test apparatus includes: a temperature control box having a test chamber provided inside, where the temperature control box is provided with an opening, and the opening is communicated with the test chamber and configured for extraction or insertion of a battery; a rack connected to the temperature control box, where the rack and the opening are located at different sides of the temperature control box, and the rack has an accommodating cavity provided inside; and a charge/discharge module located in the accommodating cavity and configured to charge/discharge a battery in the corresponding test chamber.

In the charge/discharge test apparatus, the rack is arranged on the temperature control box, and the charge/discharge module is accommodated in the accommodating cavity of the rack, achieving overall integration of the charge/discharge module and the temperature control box. In this way, during the testing, the battery is put into the test chamber from the opening, and the charge/discharge module in the accommodating cavity is electrically connected to the battery in the test chamber, such that the battery experiences a charge/discharge test at a required temperature. Because the rack and the opening are arranged at different sides of the temperature control box, on the premise of effective charge/discharge test, the charge/discharge module and the temperature control box are organically combined, which greatly relieves the issues of low integration and large space occupation of the charge/discharge test apparatus.

In some embodiments, the charge/discharge test apparatus further includes a connection mechanism electrically connected to the charge/discharge module, where the connection mechanism is located in the accommodating cavity, and is capable of at least partially extending into the test chamber for electrically connecting to the battery. In this way, the connection mechanism located in the accommodating cavity extends into the test chamber, such that the integrated charge/discharge test apparatus can connect the charge/discharge module to the battery through the connection mechanism, so as to achieve the charge/discharge test of the battery.

In some embodiments, the connection mechanism includes a driving member and an electric connector, where the driving member is arranged in the accommodating cavity, and the electric connector is electrically connected to the charge/discharge module, extends from the accommodating cavity to the test chamber, and connects to or disconnects from the battery under the driving of the driving member. In this way, in the process of connection test, a driver can be used to drive the electric connector to move, such that the electric connector extends into the test chamber to connect to the battery, so as to construct a conductive path between the charge/discharge module and the battery, thereby completing an automatic connection between the charge/discharge module and the battery, realizing the test automation requirements, and improving the test efficiency.

In some embodiments, the charge/discharge test apparatus further includes an electric terminal located in the test chamber, and a portion of the electric connector extending into the test chamber is configured to contact with or disconnect from the electric terminal, and the electric terminal is configured to electrically connect to the battery. In this way, the electric connector between the battery and the charge/discharge module is automatically fulfilled through the contact or disconnection between the electric connector and the electric terminal, achieving the automated testing and improving the testing efficiency.

In some embodiments, the charge/discharge test apparatus further includes a load-bearing assembly located in the test chamber, the electric terminal is arranged on the load-bearing assembly, and the load-bearing assembly is configured to support the battery. In this way, the electric terminal is integrated on the load-bearing assembly, such that the battery can be integrated with the load-bearing assembly before testing. In this way, a test end of the battery is transferred to the electric terminal, the connection interface is unified, and the battery is automatically tested.

In some embodiments, the connection mechanism further includes a first detection terminal driven by the driving member, and the charge/discharge test apparatus further includes a second detection terminal located in the test chamber, where the first detection terminal contacts with or disconnects from the second detection terminal under the driving of the driving member. In this way, the first detection terminal is driven by the driving member to move, such that when the electric connector abuts against the electric terminal, the electrical contact between the first detection terminal and the second detection terminal is also automatically completed, which not only meets the multifunctional test requirements of the battery but also greatly improves the test efficiency.

In some embodiment, the charge/discharge test apparatus further includes a water collection tank, where the water collection tank is arranged on a side wall of the temperature control box away from the test chamber and below the electric connector. With this design, the water collection tank is arranged below the electric connector, which is convenient for collecting the condensed water generated on the electric connector, so as to reduce the influence of the condensed water on the wires and the like.

In some embodiments, the charge/discharge test apparatus further includes a temperature control module and an electric control module. The temperature control module is configured to control a temperature of the test chamber, at least part of the temperature control module is arranged in the rack, and the electric control module is electrically connected to the temperature control module and the charge/discharge module separately and is located in the rack. With this design, the temperature control module, the electric control module, and the charge/discharge module are all located on one side of the temperature control box, with a reasonable spatial layout and high integration.

In some embodiments, the charge/discharge test apparatus further includes a partitioning member, where the partitioning member is located inside the rack to partition the rack into accommodating cavities, and the charge/discharge module is arranged on the partitioning member. In this way, the partitioning member is used to partition the rack into accommodating cavities, such that charge/discharge modules can be stored stably. In addition, the partitioning member can also separate the charge/discharge modules, standardizing the arrangement of the charge/discharge modules, reducing the mutual extrusion between devices, and improving the service life of the charge/discharge modules.

In some embodiments, fixation positions are provided and spaced apart from each other in the rack, where the partitioning member is detachably connected to the fixation position. With this design, the partitioning member is detachably connected to the fixation position, and a volume of the accommodating cavity can be changed by changing a position for fixing the partitioning member relative to the rack, so as to increase the applicability of the charge/discharge test apparatus.

In some embodiments, the charge/discharge test apparatus further includes a support assembly, where the support assembly is connected to an inner wall of the rack, and the support assembly has sliding tracks for the partitioning member to slide. With this design, sliding tracks are used to facilitate the insertion of partitioning member into the rack in a sliding manner, reducing the difficulty during the extraction or insertion of the partitioning member. This is conductive to improving the assembly efficiency of the charge/discharge test apparatus.

In some embodiments, the support assembly includes a first support member and a second support member that are arranged on the inner wall of the rack, where the first support member and the second support member are spaced apart from each other along a height direction of the charge/discharge test apparatus to form the sliding tracks. With this design, the first support member and the second support member are used to enclose the sliding track, which is convenient for the partitioning member to be stably installed between the first support member and the second support member.

In some embodiments, the first support member includes a first connecting portion and a first support portion that are connected to each other, where the first connecting portion is connected to the inner wall of the rack; and the second support member includes a second connecting portion and a second support portion that are connected to each other, where the second connecting portion is connected to the first connecting portion, and the second support portion and the first support portion are opposite each other and spaced apart from each other to form the sliding tracks. In this way, the first support member is designed as the first connecting portion and the first support portion, and the second support member is designed as the second connecting portion and the second support portion, which not only facilitates the installation of the first support member and the second support member in the rack, but also facilitates the formation of the sliding tracks between the first support member and the second support member.

In some embodiments, in the height direction of the charge/discharge test apparatus, the first support portion is located at an upper side of the partitioning member, the second support portion is located at a lower side of the partitioning member, and in an extension direction of the sliding track, a length L2 of the second support portion is less than a length L1 of the first support portion. In this way, the second support portion in the extension direction of the sliding track is relatively short, so as to reduce the frictional force when the partitioning member slides along the sliding track, thereby reducing the difficulty in the process of extraction or insertion of the partitioning member from or into the sliding tracks.

In some embodiments, the partitioning member is provided with a via hole, and the charge/discharge module is connected to the partitioning member through the via hole. In this way, the introduction of the via hole can better fix the charge/discharge module to the partitioning member located below the charge/discharge module, reducing the probability of the charge/discharge module being tilted and misaligned.

In some embodiments, the charge/discharge test apparatus further includes a thermal management mechanism, where the thermal management mechanism is arranged in the rack and is configured to at least perform thermal management on a temperature in the rack. In this way, with the thermal management mechanism provided, the temperature of devices in the rack can be controlled, such that the devices can operate stably.

In some embodiments, the thermal management mechanism includes a heat exchanger and an input pipe communicated with the heat exchanger, where the heat exchanger is arranged in the rack, and the input pipe is configured to transport heat exchange medium to the heat exchanger. In this way, the heat exchange medium is input into the heat exchanger through the input pipe, such that heat transfer is implemented between the heat exchanger and the rack, which effectively reduces the temperature in the rack and allows the devices in the rack to operate stably.

In some embodiments, the thermal management mechanism further includes an output pipe, where the output pipe is communicated with the heat exchanger. With this design, the heat exchange medium can be output from the heat exchanger through the output pipe, such that the heat exchange medium forms a flow circulation in the heat exchanger, improving the heat exchange efficiency.

In some embodiments, the charge/discharge test apparatus further includes an opening and closing mechanism and a door body that are arranged on the temperature control box, where the opening and closing mechanism is configured to drive the door body to open or close the opening. In this way, the opening and closing mechanism is used to drive the door body to automatically open or close the opening, such that the charge/discharge test process of the battery is automatically controlled.

In some embodiments, the opening and closing mechanism includes an opening and closing device, a connecting member, and a driving shaft driven by the opening and closing device to expand and contract, where the opening and closing device and the connecting member are respectively arranged on the temperature control box and the door body, and the driving shaft is rotationally connected to the connecting member. In this way, the opening and closing device drives the driving shaft to expand and contract, and drives the connecting member to move together, such that the door body moves away from or close to the opening, implementing the automatic opening and closing of the door body.

In some embodiments, the charge/discharge test apparatus further includes a locking mechanism, where the locking mechanism is configured to lock a side of the door body away from the opening and closing mechanism to the temperature control box or release such locking. In this way, the door body is locked to the temperature control box through the locking mechanism, such that the risk of the door body being pushed open by the pressure in the temperature control box can be reduced. In addition, the door body can also be tightly fitted at the opening to provide a closed environment for the temperature control box, which makes the test environment more controllable and is conductive to improving the reliability of the test results.

In some embodiments, the locking mechanism includes a lock seat and a movable member, where in the temperature control box and the door body, one is provided with the lock seat, the other is movably provided with the movable member, and the lock seat has a lock groove that cooperates with the movable member. In this way, the cooperation between the lock groove of the lock seat and the movable member makes the locking and unlocking operations of the door body easier.

In some embodiments, the charge/discharge test apparatus further includes a heating member, where the door body is provided with a viewing zone for observing the test chamber, and the heating member is arranged around the periphery of the viewing zone. In this way, the heating member is arranged on the periphery of the viewing zone, and the heating function of the heating member is used to evaporate the condensation on the viewing zone, implementing the anti-condensation effect under the low-temperature test.

In some embodiments, the charge/discharge test apparatus includes a first direction, a second direction, and a third direction that are perpendicular to each other, and the temperature control box is arranged with one side in the first direction toward the rack; where an openable cover plate is provided on one side of the rack in the second direction, and the cover plate is provided with heat emission holes communicated with the accommodating cavity. In this way, the introduction of the heat emission holes on the cover plate is beneficial to the cooling of the charge/discharge module, so as to improve the service life of the charge/discharge module.

In some embodiments, the charge/discharge test apparatus further includes a sealing plate, where a first hollow carved zone is provided on a top of the rack along the third direction, and the sealing plate at least covers the first hollow carved zone. With this design, introduction of the sealing plate can reduce the probability of external rainwater and the like entering the charge/discharge test apparatus, thereby improving the service life of the charge/discharge test apparatus.

According to a second aspect, this application provides a battery test system, including the charge/discharge test apparatus according to any one of the foregoing embodiments.

In some embodiments, the battery test system further includes a connecting assembly, the charge/discharge test apparatus is provided in at least two, and two adjacent charge/discharge test apparatuses are connected through the connecting assembly. In this way, the connecting assembly is arranged between two adjacent charge/discharge test apparatuses, such that the two adjacent charge/discharge test apparatuses are connected as a whole, which can effectively reduce the risk of a single charge/discharge test apparatus falling over.

In some embodiments, the connecting assembly includes a connecting beam and a seat body, where the connecting beam and the seat body are respectively arranged on two of the charge/discharge test apparatuses, and the seat body is provided with a slot for the connecting beam to be inserted. In this way, it is not only convenient for connecting two charge/discharge test apparatuses, but also is beneficial to improving the connection strength between the charge/discharge apparatuses, thereby enhancing the stability of the apparatuses.

According to a third aspect, this application provides a battery production system, including the battery test system according to any one of the foregoing embodiments.

Figure 1:
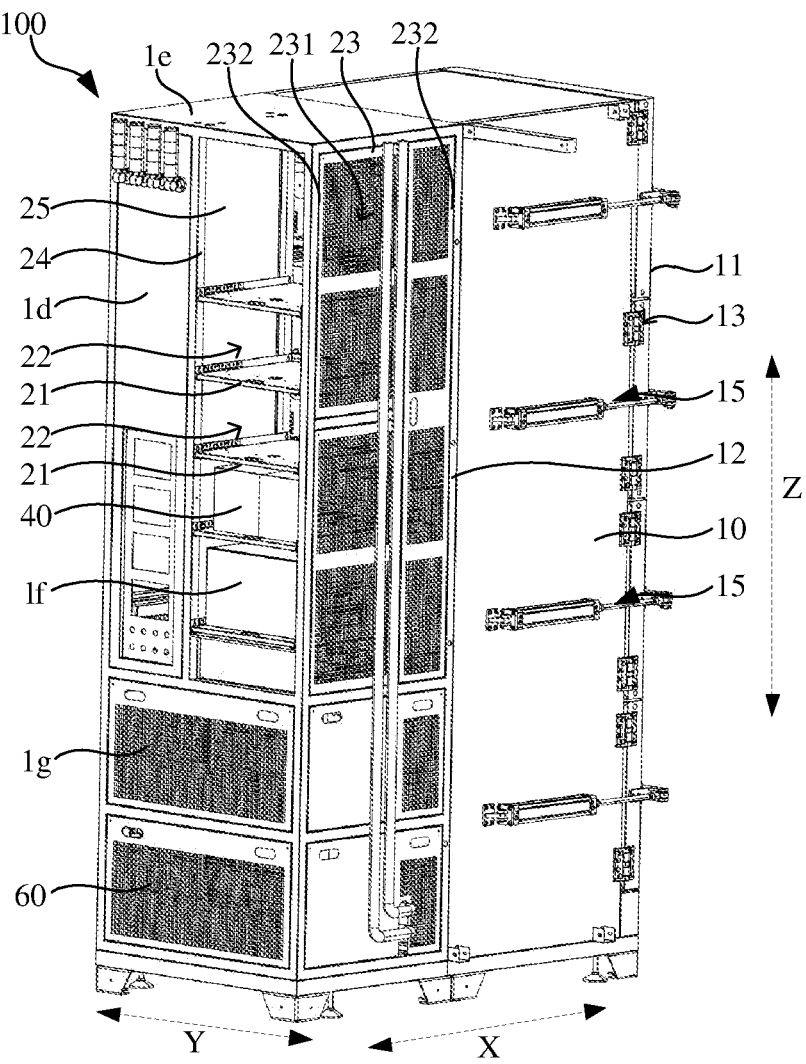
FIG. 1 is a perspective view of a structure of a charge/discharge test apparatus described in one or more embodiments.

100. charge/discharge test apparatus; 10. temperature control box; 11. first side; 12. second side; 13. opening; 14. test chamber; 141. second side wall; 15. opening and closing mechanism; 151. opening and closing device; 152. driving shaft; 153. connecting member; 16. locking mechanism; 161. lock seat; 16a. lock groove; 162. movable member; 17. door body; 171. viewing zone; 1a. water collection tank; 1b. wiring member; 1c. temperature control module; 1d. electric control module; 1e. sealing plate; 1f. charge/discharge control module; 1g. condensing unit; 20. rack; 21. partitioning member; 211. via hole; 22. accommodating cavity; 23. cover plate; 231. heat emission hole; 232. side edge; 24. fixation position; 25. first side wall; 30. support assembly; 31. first support member; 311. first connecting portion; 312. first support portion; 32. second support member; 321. second connecting portion; 322. second support portion; 33. sliding track; 40. charge/discharge module; 50. connection mechanism; 51. driving member; 511. output shaft; 52. electric member; 521. first end; 522. second end; 53. first detection terminal; 54. first adapter assembly; 55. second adapter assembly; 56. fastener; 60. thermal management mechanism; 61. heat exchanger; 62. input pipe; 63. output pipe; 70. load-bearing member; 71. electric terminal; 72. second detection terminal; 73. first load-bearing member; 74. second load-bearing member; 80. heater; 81. fan; 82. driving source; 200. connecting assembly; 210. connecting beam; 220. seat body; 230. slot; X. first direction; Y. second direction; and Z. third direction.

DESCRIPTION OF EMBODIMENTS

To make the objectives, features and advantages of this application more comprehensible, the following further describes specific implementations of this application in detail with reference to the accompanying drawings. In the following descriptions, numerous specific details are set forth in order to provide a thorough understanding of this application. However, this application can be implemented in many other ways different from those described herein, and those skilled in the art can make similar improvements without violating the connotation of this application. Therefore, this application is not restricted by the specific embodiments disclosed below.

In the descriptions of this application, it should be understood that if the terms "center", "vertical", "transverse", "length", "width", "thickness", "upper", "lower", "front", "rear", "left", "right", "perpendicular", "horizontal", "top", "bottom", "inside", "outside", "clockwise", "counterclockwise", "axial", "radial", "circumferential", and the like present, the orientations or positional relationships indicated by these terms are based on the orientations or positional relationships shown in the accompanying drawings, are merely intended to facilitate the descriptions of this application and simplify the descriptions, are not intended to indicate or imply that the apparatuses or components mentioned in this application must have specific orientations, or be constructed and operated for a specific orientation, and therefore shall not be construed as a limitation to this application.

In addition, if the terms "first" and "second" present, these terms are merely for the purpose of description, and shall not be understood as any indication or implication of relative importance or any implicit indication of the number of technical features indicated. Therefore, a feature defined by "first" or "second" may explicitly or implicitly include at least one such feature. In the description of this application, if the term "plurality" presents, the meaning of "plurality" is at least two, for example two or three, unless otherwise specifically defined.

In this application, unless otherwise specified and limited, if the terms "installation", "connection", "connection", and "fixation" present, these terms should be understood in their general senses. For example, they may refer to a fixed connection, a detachable connection, or an integral connection, may refer to a mechanical connection or electrical connection, any may refer to a direct connection, an indirect connection via an intermediate medium, or an interaction between two components, unless otherwise expressly specified. A person of ordinary skills in the art can understand specific meanings of these terms in this application as appropriate to specific situations.

In this present, unless otherwise expressly specified and defined, if a similar description of the first feature being "above" or "below" the second feature present, the meaning of these terms may mean that the first is in direct contact with the second feature or may mean that the first feature and the second feature come into contact indirectly through an intermediary. Moreover, that the first feature is "above", "over", or "on" the second feature may mean that the first feature is directly above or obliquely above the second feature or simply mean that the first feature has a higher level than the second feature. That the first feature is "below", "beneath", and "under" the second feature may mean that the first feature is directly below or obliquely below the second feature or simply mean that the first feature has a lower level than the second feature.

It should be noted that if a component is referred to as being "fastened to" or "disposed on" another component, it may be directly fastened to the another component, or there may be a component in between. If a component is deemed as being "connected to" another component, it may be directly connected to the another component, or there may be a component in between. If presents, the terms "vertical", "horizontal", "upper", "lower", "left", "right", and other similar expressions as used in this application are for illustration only, and are not intended to represent the only embodiment.

Currently, from a perspective of the market development, application of traction batteries is being more extensive. Traction batteries have been not only used in energy storage power supply systems such as hydroelectric power plants, thermal power plants, wind power plants, and solar power plants, but also widely used in many other fields including electric transportation tools such as electric bicycles, electric motorcycles, and electric vehicles, military equipment, and aerospace. With continuous expansion of application fields of traction batteries, market demands for the traction batteries are also expanding.

During the battery production, to make the output products meet the production requirements, the batteries need to be tested. For example, the batteries experience the charge/discharge test, the voltage acquisition test, the temperature acquisition test, and the pressure acquisition test. An existing charge/discharge test apparatus generally includes a temperature control box and a charge/discharge module, where the temperature control box and the charge/discharge module are placed separately on two separate floors in the laboratory. Before testing, the separately placed temperature control box and charge/discharge module should be placed together. It can be learned that in the existing charge/discharge test apparatus, no effective integration between the temperature control box and the charge/discharge module is fully considered, which not only causes the need to manually transport the devices before the test, but also causes extremely inconvenience to the battery test. In addition, there is a problem of large occupied space.

Based on this, to resolve the problem of large space occupation caused by insufficient integration of the existing charge/discharge test apparatus, in this application, a charge/discharge test apparatus is designed. A rack is arranged on a temperature control box, and a charge/discharge module is accommodated in a accommodating cavity of the rack, achieving overall integration between the charge/discharge module and the temperature control box. In this way, during the testing, a battery is put into a test chamber from an opening, and the charge/discharge module in the accommodating cavity is electrically connected to the battery in the test chamber, such that the battery experiences a charge/discharge test at a required temperature. Because the rack and the opening are arranged at different sides of the temperature control box, on the premise of effective charge/discharge test, the charge/discharge module and the temperature control box are organically combined, which greatly relieves the issues of low integration and large space occupation of the charge/discharge test apparatus.

Figure 2:
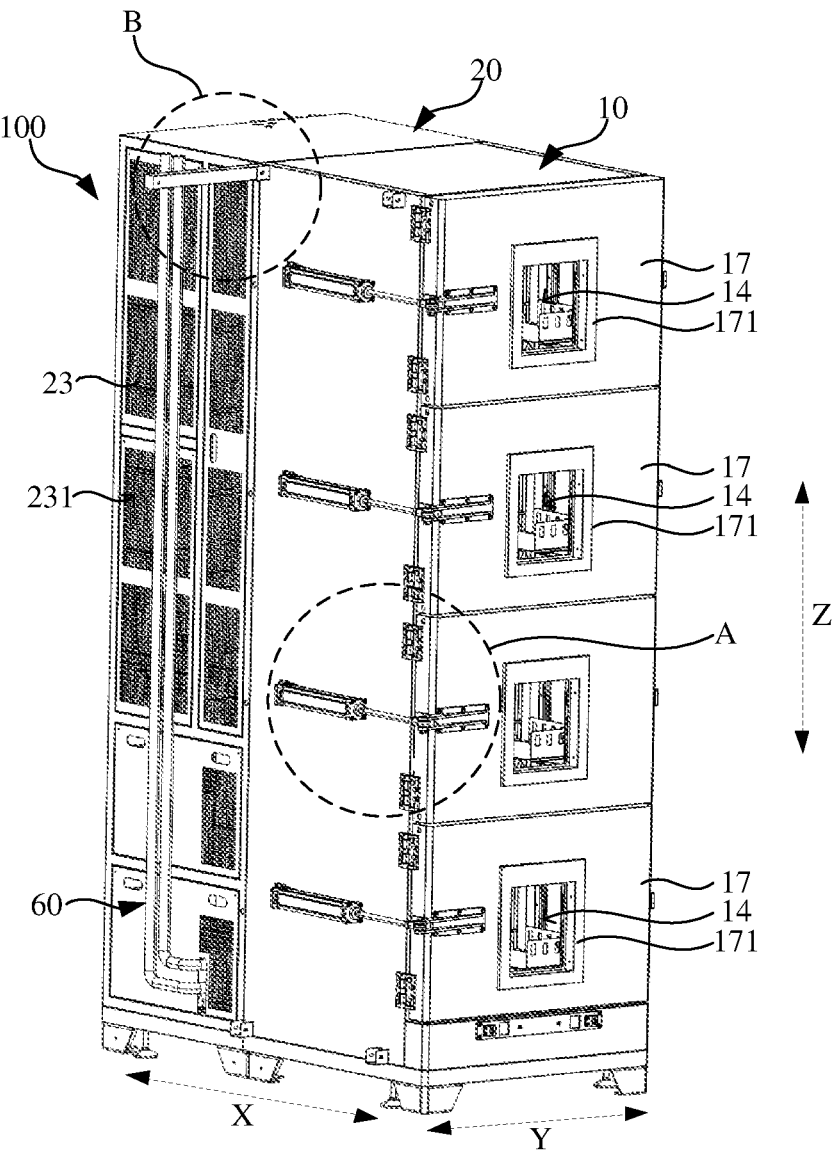
FIG. 2 is another perspective view of the structure of the charge/discharge test apparatus in FIG. 1.

According to some embodiments of this application, referring to FIG. 1 and FIG. 2, this application provides a charge/discharge test apparatus 100. The charge/discharge test apparatus 100 includes a temperature control box 10, a rack 20, and a charge/discharge module 40. The temperature control box 10 has a test chamber 14 provided inside, and the temperature control box 10 is provided with an opening 13, where the opening 13 is communicated with the test chamber 14 and configured for extraction or insertion of a battery. The rack 20 is connected to the temperature control box 10, the rack 20 and the opening 13 are located at different sides of the temperature control box 10, and the rack 20 has an accommodating cavity 22 inside. The charge/discharge module 40 is located in the accommodating cavity 22 and configured to charge/discharge a battery in the corresponding test chamber 14.

The temperature control box 10 may be referred to as a high-low temperature box. The test chamber 14 is a chamber used to bear to-be-tested batteries, and the to-be-tested batteries can undergo the charge/discharge test in the test chamber 14. When the batteries are located in the test chamber 14 and undergo charging and discharging, temperature in the test chamber 14 can be maintained at a predetermined temperature. The predetermined temperature may exceed room temperature, for example, may be, but is not limited to, 40° C. and 50° C. Alternatively, the predetermined temperature may be lower than room temperature, for example, 0° C. and −10° C. The temperature in the test chamber 14 may be specifically set according to test requirements.

The rack 20 refers to a structure for storing the charge/discharge modules 40, and the accommodating cavity 22 in the rack is used for accommodating the charge/discharge modules 40. In the rack 20, the number of accommodating cavities 22 may be one or more. When the number of accommodating cavities 22 is plural, the plurality of charge/discharge modules 40 can be distributed in different accommodating cavities 22, which can improve the testing ability of the charge/discharge test apparatus 100 and can allow different charge/discharge modules 40 to be placed separately, thereby reducing the extrusion between the charge/discharge modules 40. Similarly, the number of test chambers 14 may be one or more, and a relationship between the number of test chambers 14 and the number of accommodating cavities 22 may be one-to-one, or may be many-to-one, to be specific, batteries in the plurality of test chambers 14 can be charged and discharged by the charge/discharge module 40 in one accommodating cavity 22.

Understandably, the rack 20 can be understood as being formed by a plurality of columns connected to each other. Referring to FIG. 1, a third hollow carved zone is provided on a side of the rack 20 facing away from the test chamber 14, the charge/discharge module 40 includes an operating interface, and the operating interface is exposed from the third hollow carved zone. This design is convenient for testers to operate the charge/discharge modules 40.

There are many ways to arrange the rack 20 in the temperature control box 10, for example, the rack 20 may be adjacent to the temperature control box 10, and there can be a certain gap between the rack 20 and the temperature control box 10; or the rack 20 may be directly attached and fixed to the temperature control box 10. The rack 20 and the opening 13 are located at different sides of the temperature control box 10, which can reduce the interference of the rack 20 on the placement of battery through the opening 13.

The rack 20 and the opening 13 can be located on two adjacent sides of the temperature control box 10 or on two opposite sides of the temperature control box 10. Specifically, in some embodiments, the temperature control box 10 includes a first side 11 and a second side 12 that are oppositely arranged along a first direction X of the charge/discharge test apparatus 100. The opening 13 is arranged on the first side 11, and the rack 20 is adjacent to the second side 12. With this design, space on the back (that is, the second side 12) of the temperature control box 10 can be fully used to integrate the charge/discharge modules 40 and the temperature control box 10 as a whole, with no need for additional space to place the charge/discharge modules 40, thereby improving utilization of laboratory space. The first side 11 and the second side 12 being oppositely arranged on the temperature control box 10 means that if the first side 11 is regarded as the front of the temperature control box 10, the second side 12 can be regarded as the back of the temperature control box 10. In other words, the rack 20 is disposed adjacent to the back of the temperature control box 10. In addition, the first direction X can also be understood as the thickness direction of the charge/discharge test apparatus 100.

The charge/discharge module 40, also called a battery charge/discharge device, refers to a mechanism that can provide a charge/discharge current to a to-be-tested battery. To charge/discharge the battery, the charge/discharge module 40 may include a DCDC converter, which can convert a high-voltage direct current on the ACDC converter into a low-voltage direct current. The ACDC converter is connected to the power grid and is configured to convert an alternating current into a high-voltage direct current. In addition, the charge/discharge module 40 may also integrate with acquisition modules for parameters such as temperature, voltage, resistance, and pressure, for example, temperature sensor, voltage sensor, and pressure sensor. The structure of the charge/discharge module 40 itself is not the object of improvement in this embodiment, and therefore the charge/discharge module 40 is not described in detail herein. Existing devices or existing products can be directly referred to.

The accommodating cavity 22 may accommodate one charge/discharge module 40, or may accommodate a plurality of charge/discharge modules 40. Specifically, in some embodiments, one charge/discharge module 40 is accommodated in the accommodating cavity 22, and one charge/discharge module 40 is configured to be electrically connected to a battery in one test chamber 14.

On the premise of effective charge/discharge test, the charge/discharge module 40 and the temperature control box 10 are organically combined, which greatly relieves the issues of low integration and large space occupation of the charge/discharge test apparatus 100.

According to some embodiments of this application, optionally, referring to FIG. 1, the charge/discharge test apparatus 100 further includes a partitioning member 21. The partitioning member 21 is located inside the rack 20 to partition the rack 20 into accommodating cavities 22, and the charge/discharge module 40 is arranged on the partitioning member 21.

The partitioning member 21 refers to a structure that can divide the internal space of the rack 20 into chambers for accommodating the charge/discharge modules 40, and it can be designed as a plate structure. The number of partitioning members 21 may be one or more. When the number of partitioning members 21 is plural, there are many ways to partition the rack 20 by the partitioning members 21. For example, the partitioning members 21 can horizontally partition the rack 20, such that the rack 20 is partitioned into a plurality of accommodating cavities 22 along the height direction; or the partitioning members 21 can vertically partition the rack 20, such that the rack 20 is partitioned into a plurality of accommodating cavities 22 along the thickness direction or the width direction.

There are also many ways to install the partitioning members 21 in the rack 20, for example, the installation method may be, but is not limited to, bolt connection, clamping, riveting, welding, or pin connection.

The partitioning members 21 are used to partition accommodating cavities 22 in the rack 20, such that the charge/discharge module 40 can be stored stably. In addition, the partitioning members 21 can also separate the charge/discharge modules 40, standardizing the arrangement of the charge/discharge modules 40, reducing the mutual extrusion between devices, and improving the service life of the charge/discharge modules 40.

According to some embodiments of this application, optionally, referring to FIG. 1, fixation positions 24 are spaced apart from each other in the rack 20. The partitioning member 21 is detachably connected to the fixation position 24.

The fixation position 24 is a position for fixing the partitioning member 21 in the rack 20, and has various structural designs. For example, the fixation position 24 may be designed as a supporting structure, for example, a platform or a step, or may be designed as a hole-shaped structure, for example, a threaded hole, such that the partitioning member 21 can be fixed on the fixation position 24 in a detachable manner, for example, through screws. Such design is relatively simple and easy to assemble.

The number of fixation positions 24 may be one or more. In the height direction, the rack 20 may include a plurality of fixation positions 24 spaced apart from each other. A height of the accommodating cavity 22 in the height direction can be changed by changing the position of the partitioning member 21, so as to change the volume of the accommodating cavity 22. Optionally, in the height direction, the plurality of fixation positions 24 may be arranged at equal intervals to reduce the difficulty of process preparation, where the height direction may be the third direction Z in FIG. 1.

The detachable connection between the partitioning member 21 and the fixation position 24 can be implemented in various ways, for example, but not limited to, bolt connection, clamping connection, and pin connection.

In addition, the rack 20 may include two first side walls 25 oppositely arranged, where each first side wall 25 is provided with a plurality of fixation positions 24, and the partitioning member 21 is connected between the two first side walls 25 through the fixation positions 24 on the two first side walls 25. For example, one fixation position 24 on one first side wall 25 and one fixation position 24 on the other first side wall 25 form a fixation position 24 group, and the partitioning member 21 is connected between two first side walls 25 through the fixation position 24 group. When the plurality of accommodating cavities 22 are sequentially arranged along the height direction, the two first side walls 25 may be two side walls opposite each other in the width direction, and the fixation positions 24 in one fixation position 24 group have a same distance to the horizontal plane in the height direction, so that the partitioning member 21 is parallel to the horizontal plane. The foregoing design is simple and has a better fixing effect on the partitioning member 21.

With this design, the partitioning member 21 is detachably connected to the fixation position 24, and a volume of the accommodating cavity 22 can be changed by changing the fixation position 24 of the partitioning member 21 relative to the rack 20, so as to increase the applicability of the charge/discharge test apparatus 100.

Figure 3:
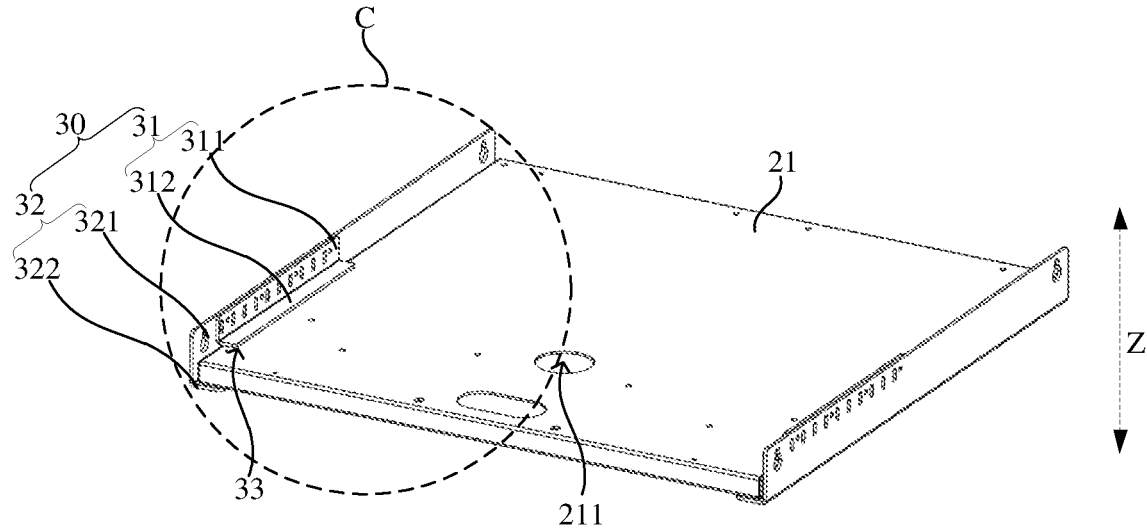
FIG. 3 is a schematic view of a matching structure of a partitioning member and a support assembly in FIG. 1.

According to some embodiments of this application, optionally, referring to FIG. 1 and FIG. 3, the charge/discharge test apparatus 100 further includes a support assembly 30, where the support assembly 30 is connected to an inner wall of the rack 20, and has sliding tracks 33 for the partitioning member 21 to slide.

The support assembly 30 refers to a structure that can be used for installing the partitioning member 21. There are many types of connection positions of the support assembly 30 in the rack 20, which can be determined according to the space required for accommodating the charge/discharge module 40. Certainly, in other embodiments, the support assembly 30 is connected to the fixation position 24 in the rack 20. The support assembly 30 and the fixation position 24 may be detachably connected or may be non-detachably connected. Non-detachably connection refers to welding, riveting, and other connection methods that require destructive means to disassemble.

The sliding track 33 refers to a structure for the partitioning member 21 to slide. When the partitioning member 21 is installed in the rack 20, the partitioning member 21 can be inserted into the sliding tracks 33 and pushed along an extension direction of the sliding tracks 33. This installation method is simple and fast and is beneficial to improving the assembly efficiency of the charge/discharge test apparatus 100. The extension direction of the sliding tracks 33 may be consistent or approximately consistent with the thickness direction of the charge/discharge test apparatus 100, to be specific, the extension direction of the sliding tracks 33 is approximately parallel to a direction in which the first side 11 of the temperature control box 10 faces the second side 12.

The sliding track 33 is used to facilitate the insertion of partitioning member 21 into the rack 20 in a sliding manner, reducing the difficulty during the extraction or insertion of the partitioning member 21. This is conductive to improving the assembly efficiency of the charge/discharge test apparatus 100.

According to some embodiments of this application, optionally, referring to FIG. 3, the support assembly 30 includes a first support member 31 and a second support member 32 that are arranged on an inner wall of the rack 20. The first support member 31 and the second support member 32 are spaced apart from each other along a height direction of the charge/discharge test apparatus 100 to form the sliding tracks 33.

The first support member 31 and the second support member 32 separately refer to two parts that constitute the sliding tracks 33. Both the first support member 31 and the second support member 32 can be directly designed as flat plates or other structures, for example, the first support member 31 and the second support member 32 can be designed as L-shaped structures.

A connection type of the first support member 31 and the second support member 32 in the rack 20 may be, but is not limited to, bolt connection, clamping, riveting, welding, or bonding.

The first support member 31 and the second support member 32 are used to enclose the sliding track 33, which is convenient for the partitioning member 21 to be stably installed between the first support member 31 and the second support member 32.

According to some embodiments of this application, optionally, referring to FIG. 3, the first support member 31 includes a first connecting portion 311 and a first support portion 312 that are connected to each other. The first connecting portion 311 is connected to an inner wall of the rack 20, and the second support member 32 includes a second connecting portion 321 and a second support portion 322 that are connected to each other. The second connecting portion 321 is connected to the first connecting portion 311, and the second support portion 322 and the first support portion 312 are opposite to each other and arranged at an interval to form the sliding tracks 33.

The first connecting portion 311 and the first support portion 312 separately refer to two parts on the first support member 31, the first connecting portion 311 mainly realizes the installation of the first support member 31 in the rack 20, and the first support portion 312 is a part of the structure that forms the sliding track 33. Similarly, the second connecting portion 321 and the second support portion 322 separately refer to two parts on the second support member 32, the second connecting portion 321 mainly realizes the installation of the second support member 32 in the rack 20, and the second support portion 322 is a part of the structure that forms the sliding track 33.

The first connecting portion 311 and the second connecting portion 321 each can be designed as a plate structure. When they are connected to each other, the second connecting portion 321 can be attached and fixed to the first connecting portion 311, referring to FIG. 4. A connection type of the first connecting portion 311 and the inside of the rack 20 (for example, the fixation position 24 in the rack 20) may be, but is not limited to, bolt connection or clamping.

The first connecting portion 311 and the first support portion 312 as well as the second connecting portion 321 and the second support portion 322 can be connected in a combined way or may be connected in an integrated way. The combined connection may be bolt connection, clamping, riveting, welding, and the like. The integrated molding method may be bending process, stamping process, die casting process, and the like.

The first support member 31 is designed as the first connecting portion 311 and the first support portion 312, and the second support member 32 is designed as the second connecting portion 321 and the second support portion 322, which not only facilitates the installation of the first support member 31 and the second support member 32 in the rack 20, but also facilitates the formation of the sliding track 33 between the first support member 31 and the second support member 32.

Figure 4:
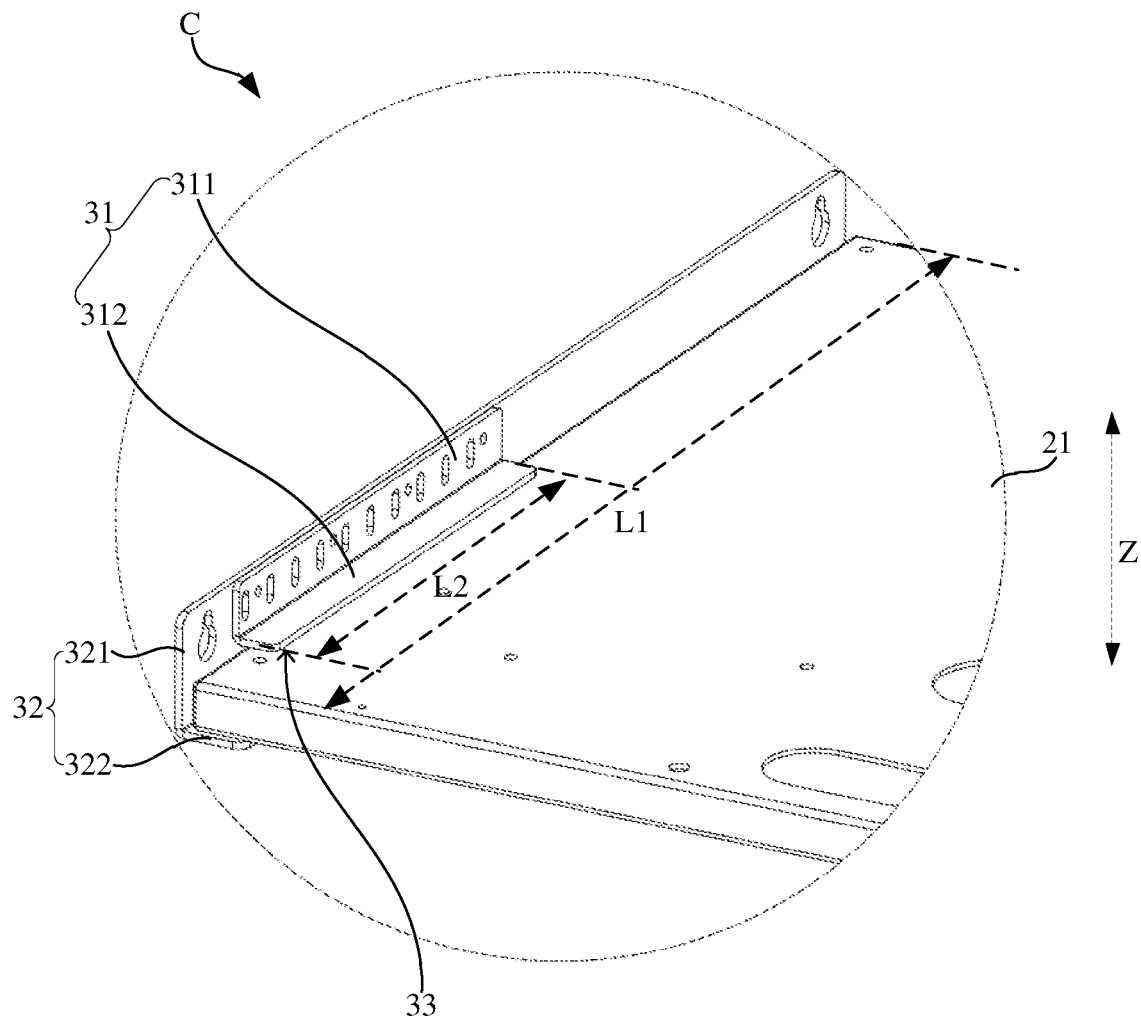
FIG. 4 is an enlarged schematic structural view of circle C in FIG. 3.

According to some embodiments of this application, optionally, referring to FIG. 4, in the third direction Z of the charge/discharge test apparatus 100, the first support portion 312 is located at an upper side of the partitioning member 21, the second support portion 322 is located at a lower side of the partitioning member 21, and in an extension direction of the sliding track 33, a length L2 of the second support portion 322 is less than a length L1 of the first support portion 312.

The first support portion 312 is located on the upper side of the partitioning member 21 and mainly supports the partitioning member 21, and the second support portion 322 is located on the lower side of the partitioning member 21 and mainly limits the partitioning member 21 in the third direction Z, which can reduce the risk of the partitioning member 21 falling from the rack 20 and injuring the operator. The length of the first support portion 312 is designed to be longer, which allows the charge/discharge module 40 to be installed more stably. However, if the length of the second support portion 322 is designed to be longer, which increases the friction between the second support portion 322 and the partitioning member 21 and hinders the extraction or insertion of the partitioning member 21.

For this reason, the length of the second support portion 322 in the extending direction of the sliding track 33 is shorter, so as to reduce the frictional force when the partitioning member 21 slides in the sliding track 33 and reduce the difficulty in the process of extraction or insertion of the partitioning member 21 from or into the sliding tracks 33.

According to some embodiments of this application, optionally, referring to FIG. 3, the partitioning member 21 is provided with a via hole 211, and the charge/discharge module 40 is connected to the partitioning member 21 through the via hole 211.

The via hole 211 may be a threaded hole or a non-threaded hole. In addition, the number of via holes 211 may be one or more. When the number of the via holes 211 is plural, specifications of some of the via holes 211 may be different from each other, where the specifications differ in shapes and/or sizes.

For example, the partitioning member 21 may be provided with a plurality of different types of via holes 211, and an average size of a first type of via holes 211 is smaller than that of a second type of via holes 211. The first type of via holes 211 may be used to connect the charge/discharge module 40 to the partitioning member 21. The second type via holes 211 may be configured for wiring. For example, some wires of the charge/discharge module 40 above the partitioning member 21 may extend into the accommodating cavity 22 below the partitioning member 21 via the second type via holes 211. This design can make the wiring between adjacent charge/discharge modules 40 easier and more regular.

The via holes 211 has a variety of distribution positions in the partitioning member 21. For example, the via holes 211 can be arranged at an end of the partitioning member 21 far away from the temperature control box 10, such that an operation interface of the charge/discharge module 40 can be exposed from a side of the rack 20 facing away from the temperature control box 10; or the via holes 211 can be provided in the middle of the partitioning member 21; and so on. When the number of via holes 211 is plural, all the via holes 211 can be arranged in various ways in the partitioning member 21. For example, all the via holes 211 may be arranged in a matrix; or may be arranged in a plurality of circles from the inside to the outside; or all the via holes 211 are arranged in an irregular dense manner.

The introduction of the via hole 211 can better fix the charge/discharge module 40 and the partitioning member 21 located below the charge/discharge module 40, reducing the probability of the charge/discharge module 40 being tilted and misaligned.

Figure 5:
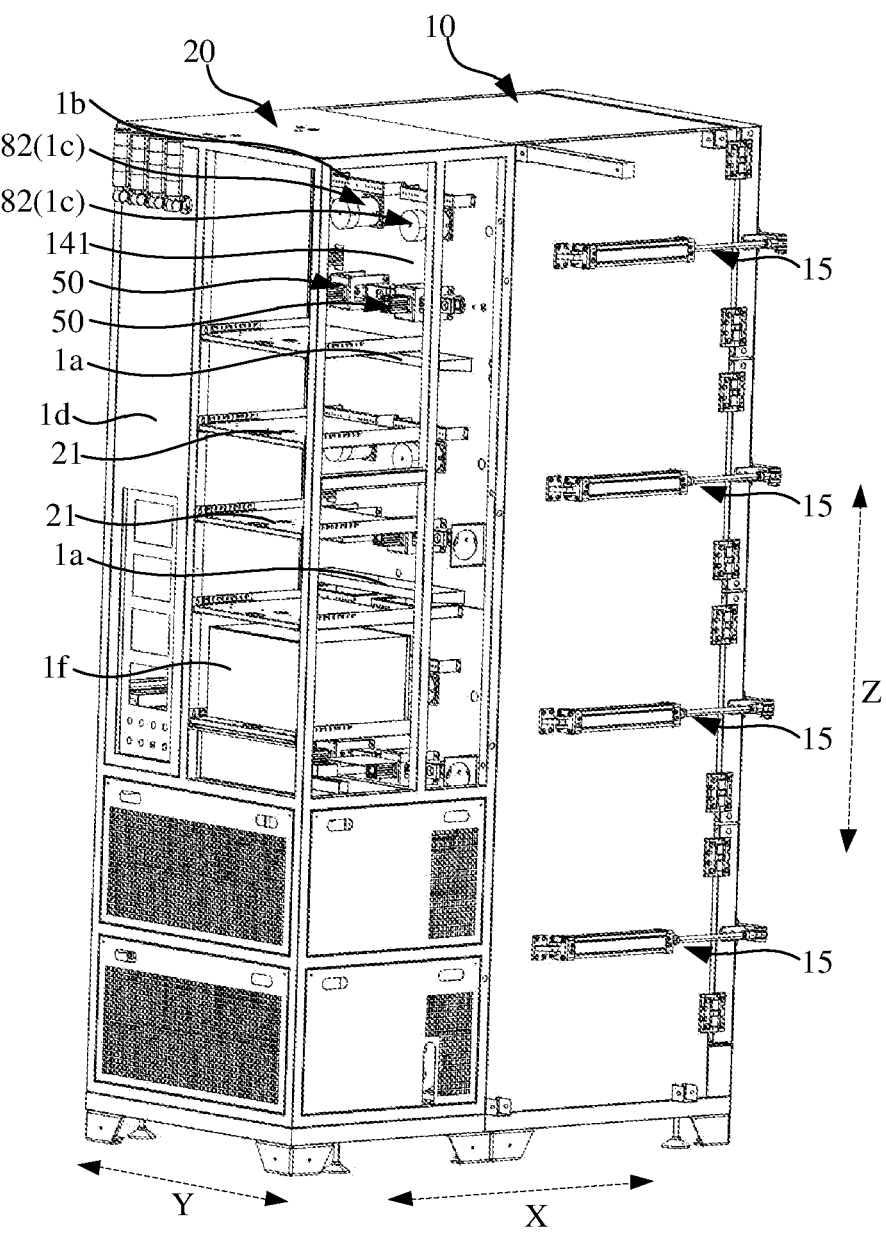
FIG. 5 is a schematic view of an internal structure of the charge/discharge test apparatus in FIG. 1.
Figure 6:
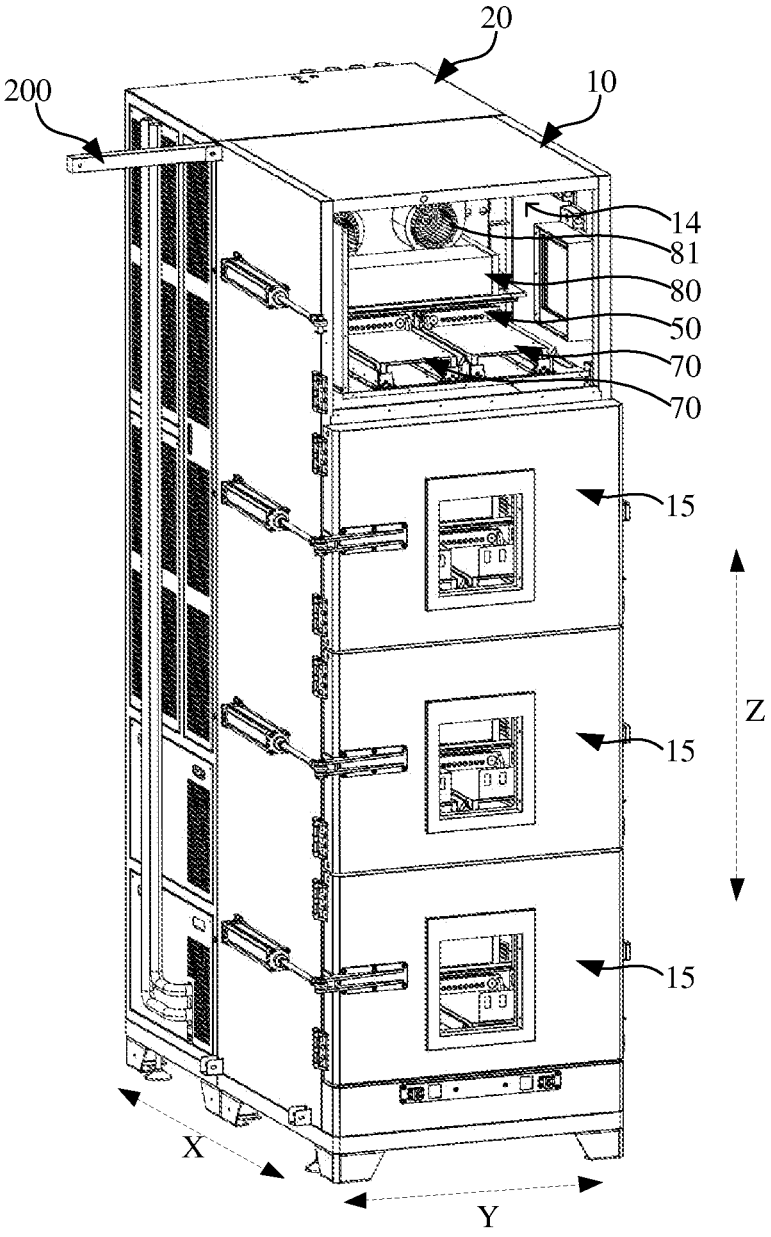
FIG. 6 is a schematic structural view of the charge/discharge test apparatus in FIG. 1 after a door body is removed.

According to some embodiments of this application, optionally, referring to FIG. 5 and FIG. 6, the charge/discharge test apparatus 100 further includes a connection mechanism 50 electrically connected to the charge/discharge module 40. The connection mechanism 50 is located in the accommodating cavity 22, and is capable of at least partially extending into the test chamber 14 for electrically connecting to the battery.

The connection mechanism 50 refers to a component that can realize electric connection between the charge/discharge module 40 and the battery. During the testing, when the battery is put into the test chamber 14, a portion of the connection mechanism 50 extending into the test chamber 14 is connected to the battery, such that the charge/discharge module 40 is electrically connected to the battery.

The portion of the connection mechanism 50 extending into the test chamber 14 and the battery are connected in many ways. For example, the connection mechanism 50 elastically abuts against a test end of the battery; or the connection mechanism 50 uses an air cylinder or an electric cylinder to drive the connecting portion to connect to a test end of the battery.

The connection mechanism 50 located in the accommodating cavity 22 extends into the test chamber 14, such that the integrated charge/discharge test apparatus 100 can connect the charge/discharge module 40 to the battery through the connection mechanism 50, so as to achieve the charge/discharge test of the battery.

Figure 7:
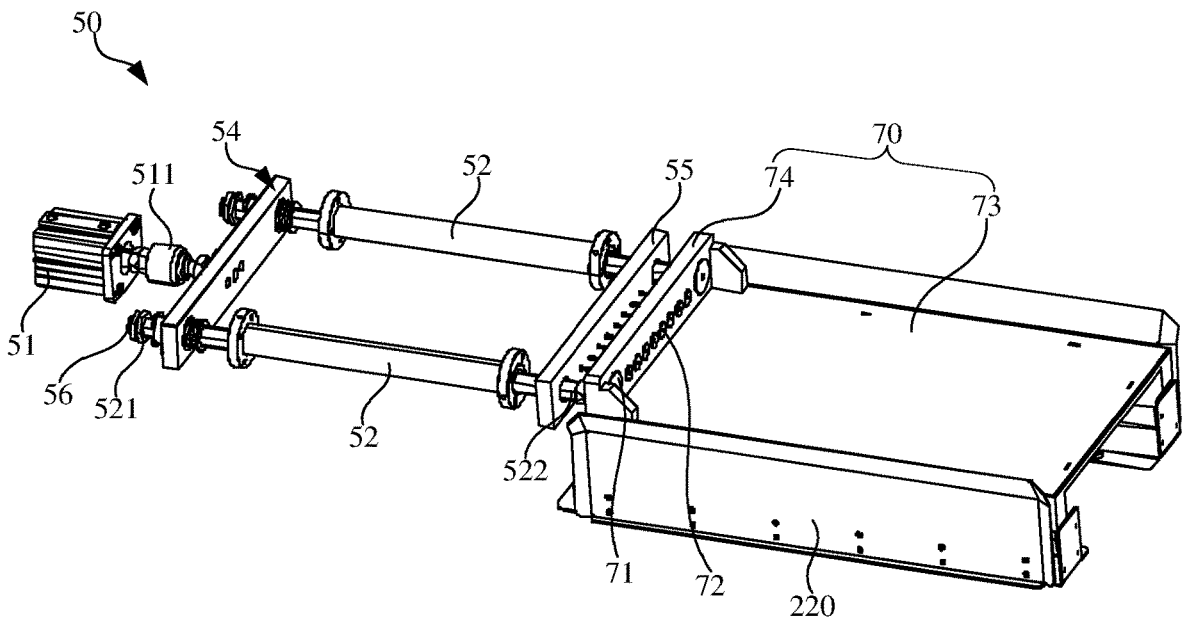
FIG. 7 is a schematic diagram of matching of a connection mechanism and a load-bearing assembly in FIG. 6.

According to some embodiments of this application, optionally, referring to FIG. 7, the connection mechanism 50 includes a driving member 51 and an electric connector 52. The driving member 51 is arranged in the accommodating cavity 22, and the electric connector 52 is electrically connected to the charge/discharge module 40, extends from the accommodating cavity 22 to the test chamber 14, and connects to or disconnects from the battery under the driving of the driving member 51.

The electric connector 52 refers to a structure that can connect to or disconnect from the battery, so as to realize the electric connection/disconnection between the charge/discharge module 40 and the battery. To enable the electric connector 52 to be driven to connect to the battery, the electric connector 52 should be made of a material with certain conductivity and structural strength during design, for example, the material may be selected from, but is not limited to, copper, aluminum, iron, or carbon. In addition, the electric connector 52 can be designed in many shapes, for example, but not limited to, a column or a plate.

The driving member 51 refers to a device that can drive the electric connector 52 toward or away from the battery. It may be, but is not limited to, an air cylinder, a hydraulic cylinder, or an electric cylinder. Certainly, the driving member 51 may also be a motor combined with a conversion mechanism, which converts the rotation motion of the motor into linear extension/retraction motion, for example, through a gear and rack assembly mechanism.

The temperature control box 10 may include a first side 11 and a second side 12 that are oppositely arranged along the first direction X. The opening 13 is arranged on the first side 11, and the rack 20 is arranged on the second side 12. The driving member 51 being arranged in the accommodating cavity 22 can be understood that the driving member 51 is located on the second side 12 of the temperature control box 10. The electric connector 52 can be understood as extending into the test chamber 14 after running through the second side wall 141 on the second side 12 of the temperature control box 10 from the outside of the temperature control box 10. The electric connector 52 may be a copper post or the like, and its axial direction may be parallel to the first direction X of the temperature control box 10.

The charge/discharge test apparatus 100 provided in this application further includes a wire and a wiring member 1b, where the wire is used for electrically connecting the charge/discharge module 40 and the electric connector 52, the wiring member 1b is arranged on a side of the second side wall 141 of the temperature control box 10 facing away from the test chamber 14, and the wire threads through the wiring member 1b. Alternatively, the wiring member 1b may be a U-shaped member, and two ends of the U-shaped member are fixedly connected to the second side wall 141.

Alternatively, one driving member 51 may be correspondingly provided with one wiring member 1b. In the foregoing design manner, the introduction of the wiring member 1b can provide more regular wiring of the wire.

In the process of connection test, a driver can be used to drive the electric connector 52 to move, such that the electric connector 52 extends into the test chamber 14 to connect to the battery, so as to construct a conductive path between the charge/discharge module 40 and the battery, thereby completing an automatic connection between the charge/discharge module 40 and the battery, realizing the test automation requirements, and improving the test efficiency.

According to some embodiments of this application, optionally, referring to FIG. 6 and FIG. 7, the charge/discharge test apparatus 100 further includes an electric terminal 71 located in the test chamber 14, and a portion of the electric connector 52 extending into the test chamber 14 is configured to contact with or disconnect from the electric terminal 71, and the electric terminal 71 is configured to electrically connect to the battery.

The electric terminal 71 refers to a component that realizes the electric connection between the battery and the charge/discharge module 40, and it can be designed into a structure, for example, but not limited to, a conductive post, a conductive sheet, or a conductive pin. There are many designs for the connection between the electric terminal 71 and the battery. For example, a battery is electrically connected to the electric terminal 71 through a conductive part such as a wire or a copper sheet, such that a connection site can be transferred from the inside of the charge/discharge module 40 to the load-bearing assembly, which can improve the ease of operation; or a device with visual function is used to automatically obtain position information of the test terminal on a battery, and then conductive parts can be crimped on the test terminal and the electric terminal 71 of the battery to realize fully automated testing.

Generally, a battery includes a positive electrode and a negative electrode, and one battery corresponds to two electric connectors 52. The charge/discharge test apparatus 100 may further include a first adapter assembly 54, the two electric connectors 52 are fixed on the first adapter assembly 54 side by side. The driving member 51 is connected to the first adapter assembly 54 and drives the two electric connectors 52 to move synchronously through the first adapter assembly 54. In this way, the driving member 51 can synchronously drive the two electric connectors 52 electrically connected to the same battery to move through the first adapter assembly 54, so as to improve the degree of automation control and improve testing efficiency.

The electric connector 52 runs through the first adapter assembly 54 and is fixed to the first adapter assembly 54. The electric connector 52 includes a first end 521 exposed from a side of the first adapter assembly 54 facing away from the test chamber 14. For example, the first adapter assembly 54 includes a first plate, and the electric connector 52 may ran through the first plate to be fixedly connected to the first plate. Further, the charge/discharge test apparatus 100 further includes a fastener 56 sleeved around the periphery of the first end 521 and pressing a wire, where the wire is used to electrically connect the charge/discharge module 40 and the electric connector 52. The fastener 56 may be a fastening screw or the like.

In addition, when the charge/discharge test needs to be carried out, the driving member 51 can drive the electric connector 52 to approach the electric terminal 71 under program instructions and the like until the electric connector 52 comes into contact with the electric terminal 71. Because the charge/discharge module 40 is electrically connected to the electric connector 52 and the electric terminal 71 is electrically connected to the battery, the charge/discharge current generated by the charge/discharge module 40 can be transferred to the battery via the electric connector 52 and the electric terminal 71. After the battery charge/discharge test is completed, the driving member 51 can drive the electric connector 52 to leave the electric terminal 71 under program instructions and the like, so as to disconnect from the electric terminal 71, and the battery is electrically disconnected from the charge/discharge module 40.

With this design, the electric connection between the battery and the charge/discharge module 40 is automatically fulfilled through the contact or disconnection between the electric connector 52 and the electric terminal 71, achieving the automated testing and improving the testing efficiency.

According to some embodiments of this application, optionally, referring to FIG. 6, the charge/discharge test apparatus 100 further includes a load-bearing assembly 70 located in the test chamber 14. The electric terminal 71 is arranged in the load-bearing assembly 70, and the load-bearing assembly 70 is configured to support the battery.

The load-bearing assembly 70 refers to a structure having an electric terminal 71 electrically connected to a battery. During the testing, the test end of the battery is electrically pre-connected to the electric terminal 71; and then the load-bearing assembly 70 and the battery as a whole abut against the electric connector 52.

To facilitate the electric connection of the battery on the load-bearing assembly 70, the load-bearing assembly 70 may include a first load-bearing member 73 and a second load-bearing member 74 arranged on the first load-bearing member 73. The first load-bearing member 73 is configured to bear the battery, and the electric terminal 71 is arranged on the second load-bearing member 74. In this way, the load-bearing assembly 70 is designed as a first load-bearing member 73 and a second load-bearing member 74, such that the battery and the electric terminal 71 are stably fixed, which facilitates the electric connection between the battery and the electric terminal 71.

The electric terminal 71 is integrated on the load-bearing assembly 70, such that the battery can be integrated with the load-bearing assembly 70 before testing. In this way, a test end of the battery is transferred to the electric terminal 71, the connection interface is unified, and the battery is automatically tested.

According to some embodiments of this application, optionally, referring to FIG. 7, the connection mechanism 50 further includes a first detection terminal 53 driven by the driving member 51, and the charge/discharge test apparatus 100 further includes a second detection terminal 72 located in the test chamber 14. The first detection terminal 53 is driven by the driving member 51 to contact with or disconnect from the second detection terminal 72.

The first detection terminal 53 refers to a structure driven by the driving member 51, and the second detection terminal 72 refers to a structure located on the load-bearing assembly 70 and corresponding to the first detection terminal 53. During the test, the first detection terminal 53 is electrically connected to the charge/discharge module 40, and the second detection terminal 72 is electrically connected to the battery. In addition, when the electric connector 52 abuts against the electric terminal 71 under the action of the driver, the first detection terminal 53 also contacts with the second detection terminal 72 synchronously.

When the first detection terminal 53 contacts with the second detection terminal 72, the charge/discharge module 40 can acquire operating parameters of the battery, for example, voltage, resistance, pressure, temperature, and other data of the battery. Specifically, in some embodiments, the first detection terminal 53 and the second detection terminal 72 are each provided in eight, in which two first detection terminals 53 and two second detection terminals 72 are used to acquire voltage data of the battery, two first detection terminals 53 (that is, positive and negative terminals) and two second detection terminals 72 are used to acquire resistance data of the battery, two first detection terminals 53 and two second detection terminals 72 are used to acquire pressure data of the battery, and two first detection terminals 53 and two second detection terminals 72 are used to acquire temperature data of the battery.

To realize the synchronous movement of the first detection terminal 53 and the electric connector, the connection mechanism 50 may further include a second adapter assembly 55 connected to the electric connector 52, and the first detection terminal 53 is connected to the second adapter assembly 55, such that the first detection terminal 53 is connected to the electric connector 52 through the second adapter assembly 55, so as to realize the synchronous movement. Specifically, in some embodiments, in an axial direction of the electric connector 52, the electric connector 52 includes a first end 521 and a second end 522 that are oppositely arranged, and the second adapter assembly 55 may include a second plate, where the second end 522 of the electric connector 52 runs through the second plate. The first detection terminal 53 may be fixedly arranged on a side of the second plate away from the first end 521, or may penetrate and be fixed on the second plate.

The first detection terminal 53 is driven by the driving member 51 to move, such that when the electric connector 52 abuts against the electric terminal 71, the electrical contact between the first detection terminal 53 and the second detection terminal 72 is also automatically completed, which not only meets the multifunctional test requirements of the battery but also greatly improves the test efficiency.

According to some embodiments of this application, optionally, referring to FIG. 5, the charge/discharge test apparatus further includes a water collection tank 1a. The water collection tank 1a is arranged on a side wall of the temperature control box 10 away from the test chamber 14 and below the electric connector 52.

During charge/discharge of the battery, a charge/discharge test below zero degree may be required to be carried out for the battery. In this case, condensed water is generated on the first end 521 of the electric connector 52 located outside the test chamber 14 due to the ambient air. The water collection tank 1a is used to collect the condensed water so as to reduce influence of the condensed water on the wire and the like.

Optionally, one test chamber 14 may be correspondingly provided with one water collection tank 1a, and orthographic projections of first ends 521 of four electric connectors 52 in one test chamber 14 on the corresponding water collection tank 1*a* are located in the corresponding water collection tank 1*a*. In this way, the structural design is relatively simple.

With this way, the water collection tank 1*a* is arranged below the electric connector 52, which is convenient for collecting the condensed water generated on the electric connector 52, so as to reduce the influence of the condensed water on the wires and the like.

According to some embodiments of this application, optionally, referring to FIG. 1 and FIG. 5, the charge/discharge test apparatus 100 further includes a temperature control module 1*c* and an electric control module 1*d*. The temperature control module 1*c* is configured to control a temperature of the test chamber 14, at least part of the temperature control module 1*c* is arranged in the rack 20, and the electric control module 1*d* is electrically connected to the temperature control module 1*c* and the charge/discharge module 40 separately.

The foregoing electric control module 1*d* can be understood as an electric control cabinet in a common sense, which may include a distribution box and the like.

Figure 12:
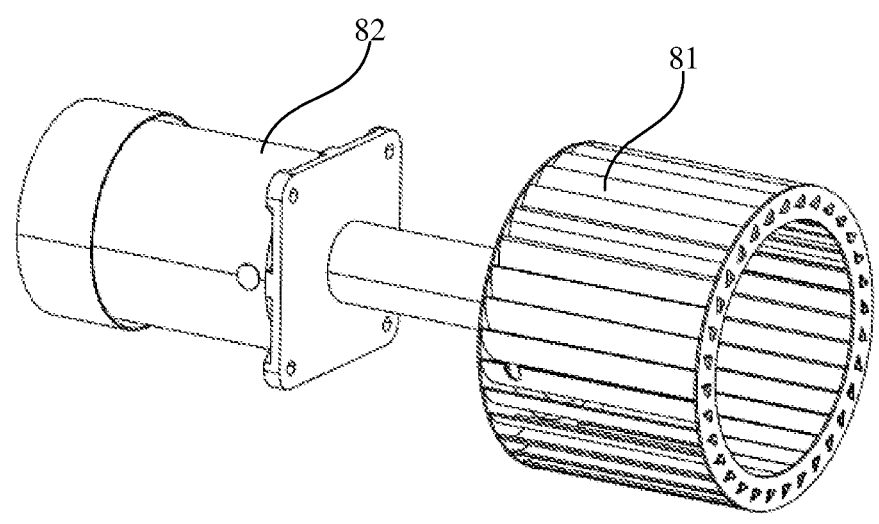
FIG. 12 is a schematic structural diagram of matching of a driving source and a fan in FIG. 6.

In the third direction Z of the rack 20 (for example, the height direction of the charge/discharge test apparatus 100), the rack 20 includes an upper portion and a lower portion that are oppositely arranged; and the temperature control module 1*c* is at least partially located at the lower portion of the rack 20, and may include a condenser group 1*g*, where the condenser group 1*g* can cool the input pipe 62 and/or the output pipe 61 of the thermal management mechanism 60. The condenser group 1*g* is mainly configured to cool the test chamber 14, and the condenser group 1*g* can be located at the bottom of the rack 20. Certainly, the temperature control module 1*c* may further include a heater 80 (as shown in FIG. 6), a fan 81 (as shown in FIG. 6), and a driving source 82 (as shown in FIG. 12) for driving the fan 81 to rotate. Referring to FIG. 6, the fan 81 and the heater 80 are located in the test chamber 14, and the heater 80 is configured to heat the test chamber 14. The fan 81 is configured to realize forced convection of air in the test chamber 14, such that temperatures at all positions in the test chamber 14 are relatively uniform. The driving source 82 can be arranged outside the test chamber 14 so as to reduce the space occupied in the test chamber 14.

The electric control module 1*d* and the charge/discharge module 40 can be arranged side by side along the second direction y, to be specific, the electric control module 1*d* and the charge/discharge module 40 can be arranged side by side along the width direction of the charge/discharge test apparatus, which is convenient for the wiring operation between the electric control module 1*d* and the charge/discharge module 40.

The rack 20 can be understood as being formed by a plurality of columns connected to each other. A third hollow carved zone (not shown) is provided on a side of the rack 20 facing away from the test chamber 14, the charge/discharge module 40 includes an operating interface, and the operating interface is exposed from the third hollow carved zone.

Referring to FIG. 1, the charge/discharge test apparatus 100 may further include a charge/discharge control module 1*f*, and a plurality of charge/discharge modules 40 are electrically connected to the charge/discharge control module 1*f*. The charge/discharge control module 1*f* refers to a device that can control each charge/discharge module 40 to independently perform a charge/discharge operation, and the charge/discharge control module 1*f* may be arranged side by side with the plurality of charge/discharge modules 40 along the third direction Z.

Additionally and optionally, the plurality of charge/discharge modules 40 may be electrically connected to the charge/discharge control module 1*f* in parallel; or a charge/discharge module 40 relatively far away from the charge/discharge control module 1*f* may be electrically connected to the charge/discharge module 40 relatively close to the charge/discharge control module 1*f*, to be specific, electrically connected to the charge/discharge control module 1*f* through the charge/discharge module 40 relatively close to the charge/discharge control module 1*f*.

In addition, it should be noted that the test chamber 14 in the charge/discharge test apparatus 100 provided in this application can be compatible with batteries of different sizes for charge/discharge test, and a reference position in the test chamber 14 can be pre-designed according to a maximum volume of a battery in to-be-tested batteries of various types. For example, the to-be-tested batteries of various types include small-sized batteries such as small soft-package laminated batteries and large-sized batteries such as batteries with a steel shell, and a dimension of the reference position in the test chamber 14 may be larger than that of a large-sized battery, such that the reference position can be used to test both large-sized and small-sized batteries. This design is convenient for testers to operate the charge/discharge modules 40.

The temperature control module 1*c*, the electric control module 1*d*, and the charge/discharge module 40 are all located on one side (for example, the second side 12) of the temperature control box 10, with a reasonable spatial layout and high integration.

Figure 8:
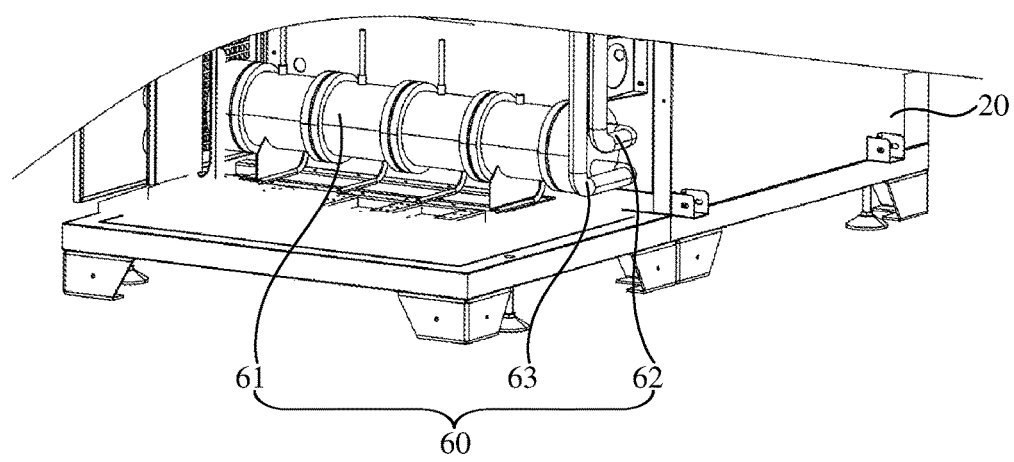
FIG. 8 is a partial schematic diagram of the internal structure of the charge/discharge test apparatus in FIG. 1.

According to some embodiments of this application, optionally, referring to FIG. 8, the charge/discharge test apparatus 100 further includes a thermal management mechanism 60. The thermal management mechanism 60 is arranged in the rack 20, and is at least configured to cool the rack 20.

The thermal management mechanism 60 refers to a component that can cool a device in the rack 20, and it can be designed as a compressor refrigeration device or a water cooling device.

With the thermal management mechanism 60 provided, the temperature of devices in the rack 20 can be cooled, such that the devices can operate stably.

According to some embodiments of this application, optionally, referring to FIG. 8, the thermal management mechanism 60 includes a heat exchanger 61 and an input pipe 62 communicating with the heat exchanger 61. The heat exchanger 61 is arranged in the rack 20, and the input pipe 62 is configured to convey a heat exchange medium into the heat exchanger 61.

The heat exchanger 61 refers to a component that can exchange heat with the inside of the rack 20, and can be provided with a structure such as a fin on its surface, so as to increase a surface heat exchange area and improve the heat exchange efficiency. The heat exchanger 61 can be designed in a plurality of positions in the rack 20. For example, in the third direction Z of the charge/discharge test apparatus 100, the heat exchanger 61 can be arranged at the bottom or top of the rack 20.

The input pipe 62 refers to a component that conveys a heat exchange medium to the heat exchanger 61. The input pipe 62 is arranged in the rack 20 and can extend from the top of the rack 20 to the bottom of the rack 20 along the third direction Z, and is communicated with the heat exchanger 61. With this design, a newly entered heat exchange medium can flow in the third direction Z, and the temperatures of the accommodating cavities 22 at different heights can be effectively controlled, for example, cooled. The heat exchange medium may b e cooling water or may be a heat exchange gas such as nitrogen and carbon dioxide.

The heat exchange medium is input into the heat exchanger 61 through the input pipe 62, such that heat transfer is implemented between the heat exchanger 61 and the rack 20, which effectively adjusts the temperature in the rack 20 and allows the devices in the rack 20 to operate stably.

According to some embodiments of this application, optionally, referring to FIG. 8, the thermal management mechanism 60 further includes an output pipe 63, where the output pipe 63 is communicated with the heat exchanger 61.

The output pipe 63 is a pipe that can output the heat exchange medium in the heat exchanger 61. The output pipe 63 can be arranged side by side with the input pipe 62; or may not be arranged side by side with the input pipe 62, for example, the output pipe 63 and the input pipe 62 are arranged crosswise.

The output pipe 63 and the input pipe 62 may both be communicated with the same end of the heat exchanger 61, or may be communicated with two opposite ends of the heat exchanger 61 respectively. When the output pipe 63 and the input pipe 62 are both communicated with the same end of the heat exchanger 61, the output pipe 63 and the input pipe 62 are arranged on the same side of the heat exchanger 61 in a side-by-side distribution mode, such that the structure of the charge/discharge test apparatus 100 is more compact.

With this design, the heat exchange medium can be output from the heat exchanger 61 through the output pipe 63, such that the heat exchange medium forms a flow circulation in the heat exchanger 61, improving the heat exchange efficiency. According to some embodiments of this application, optionally, referring to FIG. 9, the charge/discharge test apparatus 100 further includes an opening and closing mechanism 15 and a door body 17 that are arranged on the temperature control box 10, where the opening and closing mechanism 15 is configured to drive the door body 17 to open or close the opening 13.

The arrangement of the door body 17 at the opening 13 can keep the temperature in the test chamber 14 at a preset temperature during the testing. When a battery needs to be put into the test chamber 14, the door body 17 can be separated from the opening 13. When the battery is put into the test chamber 14, the door body 17 can block the opening 13, such that the test chamber 14 is closed.

The opening and closing mechanism 15 refers to a device that can automatically open or close the door body 17. Certainly, to realize automatic control, a sensor for sensing an incoming product can be arranged on the temperature control box 10. When a battery is transported to a predetermined zone, the sensor triggers the opening and closing mechanism 15 to work, and the opening and closing mechanism 15 drives the door body 17 to separate from the opening 13 to open the opening, such that the battery can be put into the test chamber 14. After the battery is connected to the charge/discharge module 40, the opening and closing mechanism 15 can drive the door body 17 to close the opening 13.

The opening and closing mechanism 15 is used to drive the door body 17 to automatically open or close the opening 13, such that the charge/discharge test process of the battery is automatically controlled.

Figure 9:
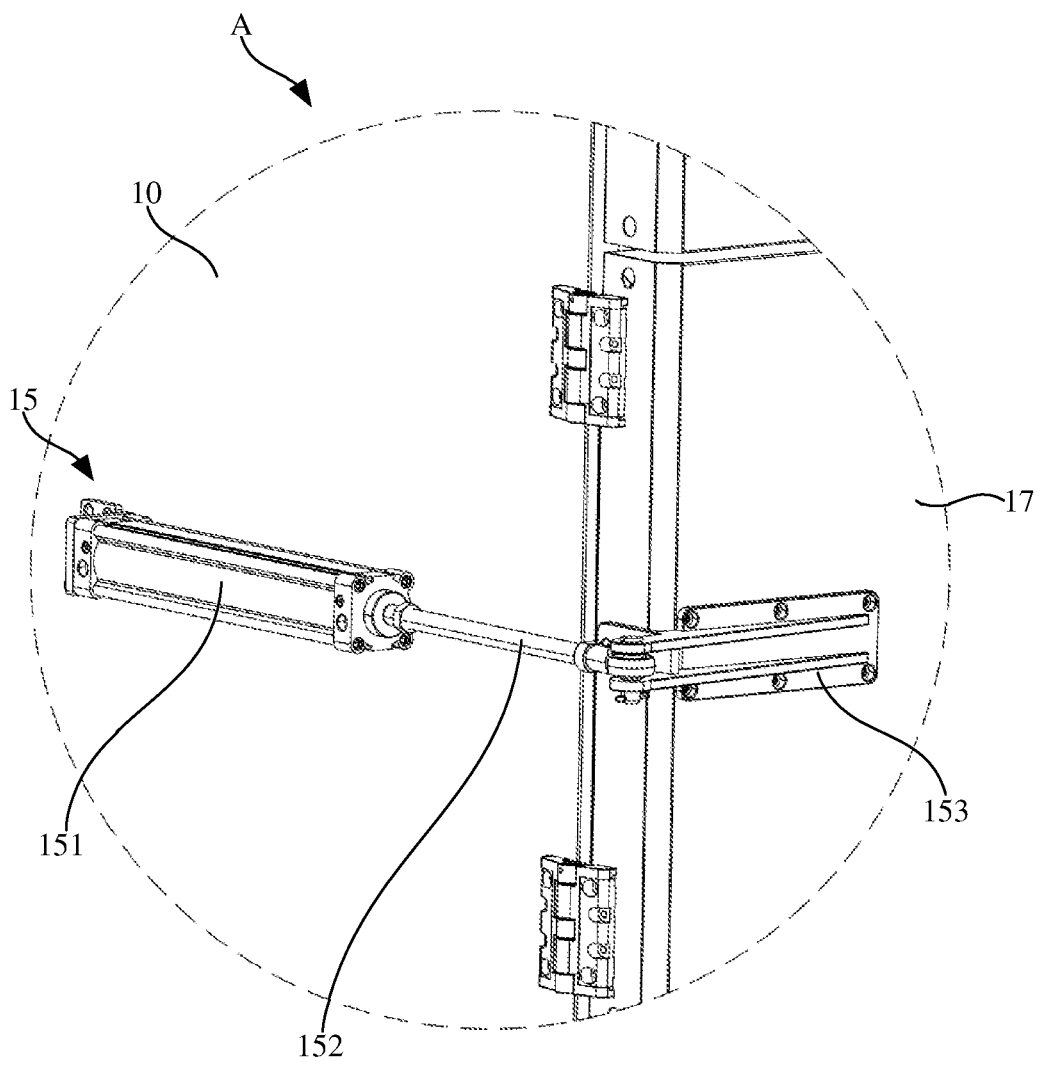
FIG. 9 is an enlarged schematic structural view of circle A in FIG. 2.

According to some embodiments of this application, optionally, referring to FIG. 9, the opening and closing mechanism 15 includes an opening and closing device 151, a connecting member 153, and a driving shaft 152 driven by the opening and closing device 151 to expand and contract. The opening and closing device 151 and the connecting member 153 are respectively provided in the temperature control box 10 and the door body 17, and the driving shaft 152 is rotatably connected to the connecting member 153.

The opening and closing device 151 is a device that provides power for automatic opening and closing of the door body 17, and it may be an air cylinder, a hydraulic cylinder, or an electric cylinder, or may be a motor and a mechanism that can convert a rotation motion into an extension/retraction motion. To enable the door body 17 to be opened and closed stably, the opening and closing device 151 can be arranged on a side of a control chamber adjacent to the first side 11 with the opening 13, and an axial direction of the driving shaft 152 is kept approximately parallel to a thickness direction of the charge/discharge test apparatus 100, to be specific, the axial direction of the driving shaft 152 is approximately parallel to a direction from the second side 12 to the first side 11.

To avoid the jamming between the driving shaft 152 and the connecting member 153 when the door body 17 is opened or closed, the driving shaft 152 and the connecting member 153 can be rotationally connected, for example, a movable shaft is fixed on the connecting member 153, and one end of the driving shaft 152 is sleeved outside the movable shaft. In addition, to facilitate the connection between the driving shaft 152 and the connecting member 153, one end of the connecting member 153 can extend beyond a side edge 232 of the door body 17 in the width direction. In addition, a connection type of the connecting member 153 on the door body 17 may be, but is not limited to, bolt connection, clamping, welding, or bonding.

The opening and closing device 151 drives the driving shaft 152 to expand and contract, and drives the connecting member 153 to move together, such that the door body 17 moves away from or close to the opening 13, implementing the automatic opening and closing of the door body 17.

Figure 10:
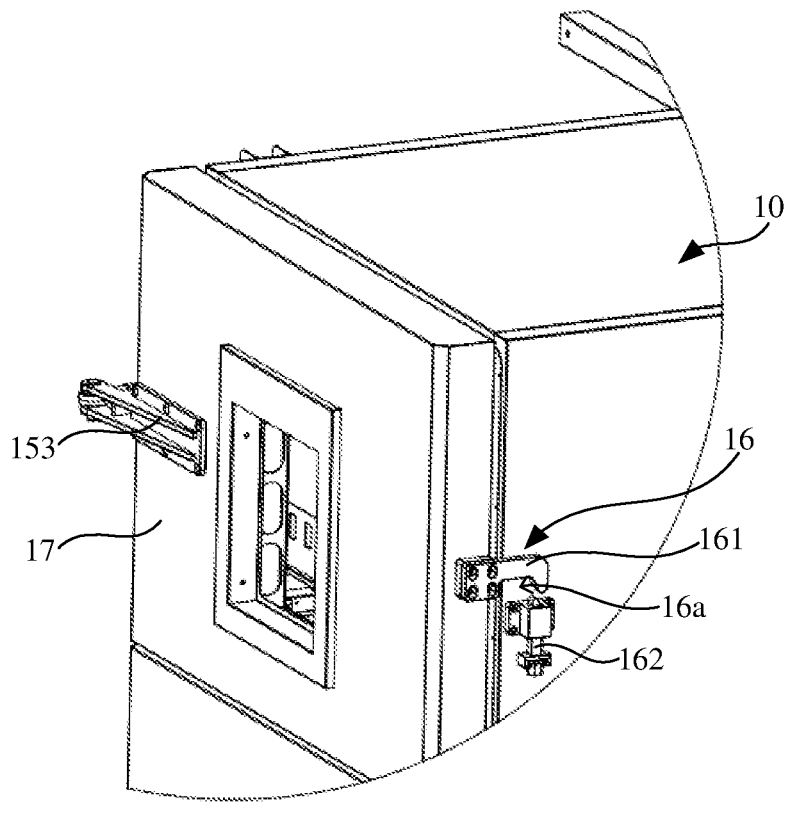
FIG. 10 is a schematic view of a local structure of a locking mechanism in FIG. 1.

According to some embodiments of this application, optionally, referring to FIG. 10, the charge/discharge test apparatus 100 further includes a locking mechanism 16. The locking mechanism 16 is configured to lock a side of the door body 17 away from the opening and closing mechanism 15 to the temperature control box 10 or release such locking.

The locking mechanism 16 refers to a component that can realize locking and unlocking between the door body 17 and the temperature control box 10. When the door body 17 is closed on the opening 13, the locking mechanism 16 operates to lock a side of the door body 17 to the temperature control box 10. When a battery needs to be taken out of the test chamber 14, a side of the door body 17 can be unlocked by the locking mechanism 16, such that the door body 17 can be opened at the opening 13.

The door body 17 is locked to the temperature control box 10 through the locking mechanism 16, such that the risk of the door body 17 being pushed open by the pressure in the temperature control box 10 can be reduced. In addition, the door body 17 can also be tightly fitted at the opening 13 to provide a closed environment for the temperature control box 10, which makes the test environment more controllable and is conductive to improving the reliability of the test results.

According to some embodiments of this application, optionally, the locking mechanism 16 includes a lock seat 161 and a movable member 162. In the temperature control box 10 and the door body 17, one is provided with the lock seat 161, the other is movably provided with the movable member 162, and the lock seat 161 has a lock groove 16*a* that cooperates with the movable member 162.

The lock seat 161 refers to a structure with a lock groove 16*a*. When the movable member 162 moves into the lock groove 16*a*, the door body 17 cannot open or close relative to the temperature control box 10. The lock groove 16*a* refers to a space in the lock seat 161 into which the movable member 162 can extend. A shape of the lock groove 16*a* can be designed in various ways, for example, the lock groove 16*a* may be a through-hole structure on the lock seat 161 or may be a groove structure formed by bending one end of the lock seat 161 toward the movable member 162.

The movable member 162 refers to a structure that can move relative to the lock seat 161 and move into the lock groove 16*a*. The movable member 162 may rotate or may move. When the movable member 162 rotates, the lock groove 16*a* on the lock seat 161 has a mouth such that the movable member 162 can be rotated into the lock groove 16*a*. When the movable member 162 moves, a moving direction of the movable member 162 should intersect with the opening and closing direction of the door body 17. If the moving direction of the movable member 162 is consistent with the opening and closing direction of the door body 17, when the door body 17 is opened, the movable member 162 is easily disengaged from the lock groove 16*a*, and the locking function cannot be realized.

There are various designs for the moving direction of the movable member 162. For example, the movable member 162 can move along the height direction of the charge/discharge test apparatus 100 on the temperature control box 10, and a notch of the lock groove 16*a* should be arranged toward the movable member 162. In this case, the lock groove 16*a* may be located above the movable member 162 or may be below the movable member 162. Moreover, the movable member 162 can move under the driving of a device such as an air cylinder, a hydraulic cylinder, or an electric cylinder. For example, when the door body 17 is closed well, a sensor of the door body 17 transmits a lock signal to the air cylinder, and in this case, the movable member 162 is pushed up by the air cylinder and locked into the lock groove 16*a*; on the contrary, when the door body 17 needs to be opened, after the air cylinder receives an opening signal, and the movable member 162 automatically disengages from the lock groove 16*a* so as to realize unlocking.

The lock seat 161 may be arranged on the door body 17, and the movable member 162 is correspondingly arranged on the temperature control box 10; or the lock seat 161 may be arranged on the temperature control box 10, and the movable member 162 is correspondingly arranged on the door body 17.

The cooperation between the lock groove 16*a* of the lock seat 161 and the movable member 162 makes the locking and unlocking operations of the door body 17 easier.

According to some embodiments of this application, optionally, the charge/discharge test apparatus 100 further includes a heating member. The door body 17 is provided with a viewing zone 171 for observing the test chamber 14, and the heating member is arranged around the periphery of the viewing zone 171.

The heating member refers to a component that has a heating function itself, for example, an electric heating wire or an electric heating tube. The viewing zone 171 is a structure for operators to observe a working state in the test chamber 14, and it can be made of a transparent material such as organic glass or inorganic glass.

The battery test may include a low-temperature environment test. Due to the temperature difference between the inside and outside of the test chamber 14, condensation easily occurs on the viewing zone 171. If it is not removed in time, the condensation not only blurs the visual effect of the viewing zone 171, but also drips into the test chamber 14, causing corrosion to the device. Therefore, a heating member is arranged on the periphery of the viewing zone 171, such that a temperature on the viewing zone 171 is increased using the heating function of the heating member to evaporate the condensation.

The heating member arranged around the periphery of the viewing zone 171 may be a completed structure or may be formed by combining a plurality of heating sections at an interval.

The heating member is arranged on the periphery of the viewing zone 171, and the heating function of the heating member is used to evaporate the condensation on the viewing zone 171, implementing the anti-condensation effect under the low-temperature test.

According to some embodiments of this application, optionally, referring to FIG. 1 and FIG. 2, the opening 13 and the rack 20 are located at two opposite sides of the temperature control box 10.

The opening 13 and the rack 20 are located at two opposite sides of the temperature control box 10, if a side on which the opening 13 is located is regarded as the front of the temperature control box 10, a side on which the rack 20 is located is the back of the temperature control box 10. Specifically, in some embodiments, the temperature control box 10 includes a first side 11 and a second side 12 that are oppositely arranged, and a direction from the first side 11 to the second side 12 is parallel to the first direction X of the charge/discharge test apparatus 100. The opening 13 is arranged on the first side 11, and the rack 20 is arranged on the second side 12.

The opening 13 and the rack 20 are located at two opposite sides of the temperature control box 10, such that the rack 20 makes full use of a space on the side of the temperature control box 10 facing away from the opening 13, thereby making a space layout more reasonable and an integration level higher; in addition, the arrangement of the rack 20 does not interfere with an extraction or insertion operation preformed on the battery at the opening 13.

According to some embodiments of this application, optionally, referring to FIG. 1, the charge/discharge test apparatus 100 includes a first direction X, a second direction Y, and a third direction Z that are perpendicular to each other, and the temperature control box 10 is arranged with one side in the first direction X toward the rack 20. An openable cover plate 23 is provided on one side of the rack 20 in the second direction Y, and the cover plate 23 is provided with heat emission holes 231 communicated with the accommodating cavity 22.

The cover plate 23 refers to a structure that can be opened from the rack 20, such that the internal structure of the rack 20 can be maintained. When the cover plate 23 is opened from the rack 20, a second hollow carved zone presents on the rack 20. In this way, the introduction of the cover plate 23 can reduce the probability of wires exposed from the second hollow carved zone, so as to make the visual effect better.

The number of the cover plates 23 may be plural, and the cover plates 23 may cover different regions of the second hollow carved zone in a side-by-side manner along the third direction Z. For ease of the opening and closing of the cover plate 23, the cover plate 23 may include two side edges 232 oppositely arranged, with one side edge 232 being pivotally connected to the rack 20 and the other side edge 232 being provided with a lock fastener, where the lock fastener is configured to restrict pivot rotation of the cover plate 23 relative to the rack 20 in a locked state. The locking fastener may be in the form of a bouncing door lock or a screw. The locked state means that the cover plate 23 is temporarily fixed relative to the rack 20. When finding that some components need to be replaced or checking the connection of wires, an operator can unlock the locking fastener to make the cover plate 23 rotate relative to the rack 20, which is convenient for the operator to maintain.

Certainly, in other embodiments, the pivot connection between the cover plate 23 and the rack 20 may alternatively be in other forms. For example, in the second direction Y, the cover plate 23 includes a first sub-cover plate 23 and a second sub-cover plate 23 that cover different regions of the second hollow carved zone in a side-by-side manner. Side edges 232 of the first sub-cover plate 23 and the second sub-cover plate 23 that are far away from each other are respectively pivoted to the rack 20, and locking fasteners are arranged between adjacent side edges 232 of the first sub-cover plate 23 and the second sub-cover plate 23, where the locking fastener is configured to simultaneously restrict, in a locked state, pivotal rotation of the first sub-cover plate 23 and the second sub-cover plate 23 relative to the rack 20, in other words, a double door is formed.

In addition, in this embodiment, the first direction X can be understood as the thickness direction of the charge/discharge test apparatus 100; the second direction y can be understood as the width direction of the charge/discharge test apparatus 100; and the third direction z can be understood as the height direction of the charge/discharge test apparatus 100.

With this design, the introduction of the heat emission holes 231 on the cover plate 23 is beneficial to the cooling of the charge/discharge module 40, so as to improve the service life of the charge/discharge module 40.

According to some embodiments of this application, optionally, referring to FIG. 1, a first hollow carved zone is provided on the top of the rack 20, and the charge/discharge test apparatus 100 further includes a sealing plate 1e, where the sealing plate 1e covers at least the first hollow carved zone.

The first hollow carved zone refers to a zone at the top of the rack 20 that can be opened to the outside, and it can be designed as a square hole zone or a circular hole zone. In other embodiments, the rack 20 is formed by connecting a plurality of columns with each other, and the first hollow carved zone communicating with the outside is formed between the columns at the top of the rack 20.

The sealing plate 1e may be made of some waterproof materials. The sealing plate 1e can cover other zones besides the first hollow carved zone, for example, a top surface of the temperature control box 10 adjacent to the first hollow carved zone.

Introduction of the sealing plate 1e can reduce the probability of external rainwater and the like entering the charge/discharge test apparatus 100, thereby improving the service life of the charge/discharge test apparatus 100.

According to some embodiments of this application, this application provides a battery test system, including the charge/discharge test apparatus 100 according to any one of the foregoing embodiments.

According to some embodiments of this application, optionally, referring to FIG. 2, the battery test system further includes a connecting assembly 200. The charge/discharge test apparatus 100 is provided in at least two, and two adjacent charge/discharge test apparatuses 100 are connected through the connecting assembly 200.

The connecting assembly 200 refers to a structure that connects two adjacent charge/discharge test apparatuses 100. The connecting assembly 200 can be designed as a complete structure or may be designed as a structure formed through splicing. A connection type of the connecting assembly 200 on the charge/discharge test apparatus 100 may be, but is not limited to, bolt connection, clamping, riveting, or welding.

The connecting assembly 200 is arranged between two adjacent charge/discharge test apparatuses 100, such that the two adjacent charge/discharge test apparatuses 100 are connected as a whole, which can effectively reduce the risk of a single charge/discharge test apparatus 100 falling over.

Figure 11:
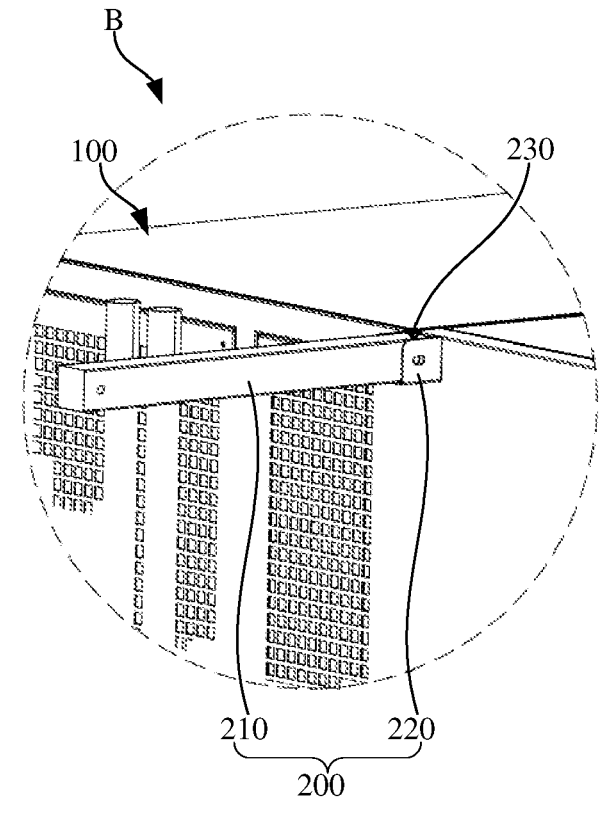
FIG. 11 is an enlarged schematic structural view of circle B in FIG. 2.

According to some embodiments of this application, optionally, referring to FIG. 11, the connecting assembly 200 includes a connecting beam 210 and a seat body 220. The connecting beam 210 and the seat body 220 are respectively arranged on two of the charge/discharge test apparatuses 100, and the seat body 220 is provided with a slot 230 for the connecting beam 210 to be inserted.

The connecting beam 210 refers to a structure in which one end is connected to the charge/discharge test apparatus 100 and the other end is connected to the seat body 220, and its length can be designed based on a distance between two charge/discharge test apparatuses 100. The seat body 220 refers to a structure connecting the connecting beam 210, and has a slot 230 in which the connecting beam 210 can be inserted. During the connection, the connecting beam 210 can be inserted into the slot 230 to initially position the connecting beam 210, which facilitates the connection between the connecting beam 210 and the seat body 220. A connection type of the connecting beam 210 and the seat body 220 may be, but is not limited to, bolt connection, clamping, riveting, or welding.

With this design, it is not only convenient for connecting two charge/discharge test apparatuses 100, but also is beneficial to improving the connection strength between charge/discharge apparatuses, thereby enhancing the stability of the apparatuses.

According to some embodiments of this application, this application provides a battery production system, including the battery test system according to any one of the foregoing embodiments.

According to some embodiments of this application, referring to FIG. 1 to FIG. 12, this application provides a charge/discharge test apparatus 100, where the charge/discharge test apparatus 100 includes a temperature control box 10, a rack 20, at least one partitioning member 21, and a plurality of charge/discharge modules 40. A plurality of test chambers 14 are arranged on the temperature control box 10. The temperature control box 10 includes a first side 11 and a second side 12 that are oppositely arranged, and openings 13 are provided on the first side 11 of the temperature control box 10 for communicating with the test chambers 14 respectively and configured for extraction or insertion of batteries. The rack 20 is adjacent to the second side 12 of the temperature control box 10, and the at least one partitioning member 21 is located inside the rack 20 to partition the rack 20 into a plurality of accommodating cavities 22. The plurality of charge/discharge modules 40 are arranged in the plurality of accommodating cavities 22 respectively and configured to charge/discharge batteries in the corresponding test chambers 14. The arrangement of the partitioning member 21 on the rack 20 can standardize the placement of the charge/discharge modules 40. A plurality of threaded holes are evenly opened on the rack 20, and the partitioning members 21 are detachably fixed to the rack 20 through the threaded holes. With distances between different partitioning members 21 adjusted, the charge/discharge modules 40 with different heights are accommodated.

Technical features in the foregoing embodiments may be combined in any way. For brevity of description, possible combinations of the technical features in the foregoing embodiments are not described all. However, as long as there is no contradiction among combinations of these technical features, all the combinations should be considered within a range recorded in this specification.

The foregoing embodiments only represent several implementations of this application, and descriptions thereof are specific and detailed, but should not be construed as a limitation on the scope of this application patent. It should be noted that those of ordinary skill in the art may further make several modifications and improvements without departing from the concept of this application, and these modifications and improvements also fall within the protection scope of this application. Therefore, the protection scope of this application should be subject to the appended claims.

What is claimed is:

1. A charge/discharge test apparatus, comprising:
a temperature control box having a test chamber provided inside, wherein the temperature control box is provided with an opening at a first side of the temperature control box, and the opening is communicated with the test chamber and configured for extraction or insertion of a battery;
a rack outside the temperature control box and connected to the temperature control box at a second side of the temperature control box, wherein the first side and the second side are two adjacent sides of the temperature control box, and the rack has an accommodating cavity inside the rack; and
a charge/discharge module located in the accommodating cavity and configured to charge/discharge the battery in the corresponding test chamber.

2. The charge/discharge test apparatus according to claim 1, further comprising:
a connection mechanism electrically connected to the charge/discharge module, wherein the connection mechanism is located in the accommodating cavity, and is capable of at least partially extending into the test chamber for electrically connecting to the battery.

3. The charge/discharge test apparatus according to claim 2, wherein the connection mechanism comprises a driving member and an electric connector, wherein the driving member is arranged in the accommodating cavity, and the electric connector is electrically connected to the charge/discharge module, extends from the accommodating cavity to the test chamber, and connects to or disconnects from the battery under the driving of the driving member.

4. The charge/discharge test apparatus according to claim 3, further comprising:
an electric terminal located in the test chamber, wherein the electric terminal is arranged toward the electric connector and configured to contact with or disconnect from the electric connector, and the electric terminal is further configured to electrically connect to the battery.

5. The charge/discharge test apparatus according to claim 4, further comprising:
a load-bearing assembly located in the test chamber, wherein the electric terminal is arranged on the load-bearing assembly, and the load-bearing assembly is configured to support the battery.

6. The charge/discharge test apparatus according to claim 3, wherein the connection mechanism further comprises a first detection terminal driven by the driving member, and the charge/discharge test apparatus further comprises a second detection terminal located in the test chamber, wherein the first detection terminal contacts with or disconnects from the second detection terminal under the driving of the driving member.

7. The charge/discharge test apparatus according to claim 3, further comprising:
a water collection tank, wherein the water collection tank is arranged on a side wall of the temperature control box away from the test chamber and located below the electric connector.

8. The charge/discharge test apparatus according to claim 1, further comprising:
a temperature control module configured to control a temperature of the test chamber, and an electric control module electrically connected to the temperature control module and the charge/discharge module, wherein at least part of the temperature control module is arranged in the rack, and the electric control module is located in the rack; and/or
an opening and closing mechanism and a door body that are arranged on the temperature control box, wherein the opening and closing mechanism is configured to drive the door body to open or close the opening.

9. The charge/discharge test apparatus according to claim 1, further comprising:
a partitioning member, wherein the partitioning member is located inside the rack to partition the rack into accommodating cavities, and the charge/discharge module is arranged on the partitioning member.

10. The charge/discharge test apparatus according to claim 9, wherein fixation positions are provided and spaced apart from each other in the rack, and the partitioning member is detachably connected to the fixation position.

11. The charge/discharge test apparatus according to claim 9, further comprising:
support assemblies, wherein the support assembly is connected to an inner wall of the rack, and the support assembly has sliding tracks for sliding of the partitioning member.

12. The charge/discharge test apparatus according to claim 11, wherein the support assembly comprises a first support member and a second support member that are arranged on the inner wall of the rack, wherein the first support member and the second support member are spaced apart from each other along a height direction of the charge/discharge test apparatus to form the sliding tracks.

13. The charge/discharge test apparatus according to claim 12, wherein:
the first support member comprises a first connecting portion and a first support portion that are connected to each other, wherein the first connecting portion is connected to the inner wall of the rack; and
the second support member comprises a second connecting portion and a second support portion that are connected to each other, wherein the second connecting portion is connected to the first connecting portion, and the second support portion and the first support portion are opposite and spaced apart from each other to form the sliding tracks.

14. The charge/discharge test apparatus according to claim 13, wherein in a height direction of the charge/ discharge test apparatus, the first support portion is located at an upper side of the partitioning member, the second support portion is located at a lower side of the partitioning member, and in an extension direction of the sliding track, a length L2 of the second support portion is less than a length L1 of the first support portion.

15. The charge/discharge test apparatus according to claim 9, wherein the partitioning member is provided with a via hole, and the charge/discharge module is connected to the partitioning member through the via hole.

16. The charge/discharge test apparatus according to claim 1, wherein the opening and the rack are located at two opposite sides of the temperature control box.

17. A charge/discharge test apparatus, comprising:
a temperature control box having a test chamber provided inside, wherein the temperature control box is provided with an opening, and the opening is communicated with the test chamber and configured for extraction or insertion of a battery;
a rack connected to the temperature control box, wherein the rack and the opening are located at different sides of the temperature control box, and the rack has an accommodating cavity inside;
a charge/discharge module located in the accommodating cavity and configured to charge/discharge the battery in the corresponding test chamber; and
a thermal management mechanism, wherein the thermal management mechanism is arranged in the rack and is configured to at least perform thermal management on a temperature in the rack.

18. The charge/discharge test apparatus according to claim 17, wherein the thermal management mechanism comprises a heat exchanger and an input pipe communicated with the heat exchanger, wherein the heat exchanger is arranged in the rack, and the input pipe is configured to transport heat exchange medium to the heat exchanger.

19. The charge/discharge test apparatus according to claim 18, wherein the thermal management mechanism further comprises an output pipe, wherein the output pipe is communicated with the heat exchanger.

20. A charge/discharge test apparatus, comprising:
a temperature control box having a test chamber provided inside, wherein the temperature control box is provided with an opening, and the opening is communicated with the test chamber and configured for extraction or insertion of a battery;
a rack connected to the temperature control box, wherein the rack and the opening are located at different sides of the temperature control box, and the rack has an accommodating cavity inside;
a charge/discharge module located in the accommodating cavity and configured to charge/discharge the battery in the corresponding test chamber; and
a partitioning member located inside the rack to partition the rack into accommodating cavities, wherein the charge/discharge module is arranged on the partitioning member, fixation positions are provided and spaced apart from each other in the rack, and the partitioning member is detachably connected to the fixation position.

\* \* \* \* \*